US010289783B1

(12) United States Patent
Khanna et al.

(10) Patent No.: US 10,289,783 B1
(45) Date of Patent: May 14, 2019

(54) SYSTEM AND METHOD FOR MANAGING CONFIGURATION DATA ASSOCIATED WITH AN ELECTRONIC DESIGN

(71) Applicant: Cadence Design Systems, Inc., San Jose, CA (US)

(72) Inventors: Rajesh Khanna, Nashua, NH (US); Matthew Timothy Bromley, Portland, OR (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 15/170,491

(22) Filed: Jun. 1, 2016

(51) Int. Cl.
*G06F 17/50* (2006.01)

(52) U.S. Cl.
CPC ................. *G06F 17/5045* (2013.01)

(58) Field of Classification Search
USPC ......................................................... 716/139
See application file for complete search history.

(56) References Cited

U.S. PATENT DOCUMENTS

| 8,527,949 | B1 * | 9/2013 | Pleis ................. | G06F 15/7867 717/121 |
| 9,886,538 | B1 * | 2/2018 | Dong ................. | G06F 17/5045 |
| 2005/0288808 | A1 * | 12/2005 | Lopez ................. | G06F 17/50 700/97 |
| 2007/0283072 | A1 * | 12/2007 | Johnson ............. | G06F 11/3664 710/305 |

* cited by examiner

*Primary Examiner* — Brian Ngo
(74) *Attorney, Agent, or Firm* — Mark H. Whittenberger, Esq.; Holland & Knight LLP

(57) ABSTRACT

The present disclosure relates to a computer-implemented method for use in an electronic circuit design. Embodiments may include providing, using at least one processor, an electronic circuit design and generating a configuration associated with a portion of the electronic circuit design. Embodiments may further include associating a label with the configuration at a graphical user interface and applying the configuration to at least one of a design object, a sub-design, or the electronic circuit design. Embodiments may also include displaying the configuration and electronic design data associated with the configuration.

20 Claims, 34 Drawing Sheets

⊕ new item or edit this list
All items

| PART_NUMBER | DESCRIPTION | MANUFACTURER | ROHS | COST | MPN |
|---|---|---|---|---|---|
| CDR-CAP-0201 | Capacitor X7R 50V 10F 5% 0603 | AVX | COMPLIANT | $0.30 | 06035C103JAT2A |
| CDR-CAP-0205 | Capacitor X7R 50V 1.5nF 5% 0603 | AVX | COMPLIANT | $0.65 | 06035C152JAT2A |
| CDR-DIO-0001 | Diode 100V 0.2A SOT23 SMD | FAIRCHILD | NON-COMPLIANT | $1.50 | BAS16 |
| CDR-FPGA-CYCLONE2-001 | ALTERA CYCLONE 2 FPGA | Altera | COMPLIANT | $4.50 | EP2C5F256C8 |
| CDR-IC-0802 | Octal D-Type Flip-Flop with 3-State Outputs SOP20, 0.5W | FAIRCHILD | COMPLIANT | $2.00 | 74CX574SJ |
| CDR-IC-0962 | 3.3V ABT OCTAL TRANSCEIVER WITH 3-STATE OUTPUTS | TI | COMPLIANT | $1.75 | SN74ALVTH245SAZQNR |
| CDR-IC-0982 | 3.3V ABT OCTAL TRANSPARENT D-TYPE LATCHES WITH 3-STATE OUTPUTS | TI | COMPLIANT | $1.25 | SN74LVTH573PW64 |
| CDR-IC-0802 | Octal D-Type Flip-Flop with 3-State Outputs QFN28, 0.3W | FAIRCHILD | COMPLIANT | $1.35 | 74CX574SDX |
| CDR-IC-9802 | 3.3V ABT OCTAL BUFFER/DRIVER WITH 3-STATE OUTPUTS | TI | COMPLIANT | $1.33 | SN74LVTH244AZQNR |
| CDR-IC-9819 | 3.3V ABT QUADRUPLE BUS BUFFERS WITH 3-STATE OUTPUTS | TI | COMPLIANT | $1.25 | SN74LVTH125PWR |
| CDR-IC-9692 | 3.3V ABT OCTAL BUFFER/DRIVER WITH 3-STATE OUTPUT | TI | COMPLIANT | $2.25 | SN74LVTH240BGYR |
| CDR-MEM-0391 | DDR3 SDRAM 16MB 6x16x8 Banks | MICRON | COMPLIANT | $2.50 | MT41J128M16HA-125-D |
| CDR-MPU-0036930 | Intel Core i7 965 | Intel | COMPLIANT | $65.00 | BX80603965 |
| CDR-REC-0001 | Rectifier 840C85R 0.5A 65-600V THT, BACC603DM | VISHAY | COMPLIANT | $2.75 | B400L800DM |
| CDR-RES-0305 | Precision Thick Film Chip Resistor 4.7k 150V 0.125W 1% | Panasonic | UNKNOWN | $1.25 | ERJ6ENF4701X |
| CDR-RES-0313 | Precision Thick Film Chip Resistor 10k 150V 0.125W 1% | Panasonic | UNKNOWN | $1.95 | ERJ6ENF1002X |
| CDR-TR-0001 | NPN Transistor 80V 0.5A SOT23 SMD | OREM | COMPLIANT | $2.25 | MMST3906LT1 |
| CDR-TR-0002 | PNP Transistor 45V 0.5A SOT33 SMD | NXP | COMPLIANT | $2.50 | BC17 |
| CDR-TR-0003 | NPN Small Signal General Purpose Amplifier & Switch, SOT363 | FAIRCHILD | COMPLIANT | $2.75 | 2N3946 |
| CDR-TR-0005 | N-Channel RF Amplifier TO92 THT | FAIRCHILD | NON-COMPLIANT | $2.95 | 2N3819 |

FIG. 10

| PART NUMBER | PRESENT IN | DESCRIPTION | | ROHS | | PART COST | |
|---|---|---|---|---|---|---|---|
| CDN-CAP-0001 | LIST1 | CAPACITOR X7R 50V 330pF 5% 0603 | | COMPLIANT | | | |
| CDN-CAP-0004 | LIST2 | | CAPACITOR X7R 50V 1nF 5% 0603 | | COMPLIANT | | $1.2 |
| CDN-CAP-0006 | LIST2 | | CAPACITOR X7R 50V 1.5nF 5% 0603 | | COMPLIANT | | $0.05 |
| CDN-CAP-0013 | LIST1 | CAPACITOR X7R 10V 0.22uF 10% 0603 | | COMPLIANT | | | |
| CDN-CAP-0015 | LIST1 | CAPACITOR X7R 10V 1nF 5% 0603 | | COMPLIANT | | | |
| CDN-CAP-0032 | LIST1 | CAPACITOR X7R 4V 4.7uF 20% 0402 | | COMPLIANT | | | |
| CDN-CAP-0034 | LIST1 | CAPACITOR X5R 6.3V 2.2uF 20% 0402 | | COMPLIANT | | | |
| CDN-CAP-0036 | LIST1 | CAPACITOR X5R 6.3V 680nF 20% 0402 | | COMPLIANT | | | |
| CDN-CAP-0038 | LIST1 | CAPACITOR X5R 6.3V 1uF 20% 0402 | | COMPLIANT | | | |
| CDN-CAP-0039 | LIST1 | CAPACITOR X5R 6.3V 2.2uF 20% 0402 | | COMPLIANT | | | |

FIG. 16

BOM Rollup

| ID | Workspace | Project | List | Part_Number | Manufacturer | MPN | ROHS |
|---|---|---|---|---|---|---|---|
| 307 | Electrical_Control_Assembly | ascent_stage_eca_1_week | SPL | CDN-CAP-0301 | AVX | 08055C331JAT2A | COMPLIANT |
| 308 | Electrical_Control_Assembly | ascent_stage_eca_1_week | SPL | CDN-CAP-0013 | AVX | 08052C224KAT2A | COMPLIANT |
| 309 | Electrical_Control_Assembly | ascent_stage_eca_1_week | SPL | CDN-CAP-0015 | AVX | 06031C102JAT2A | COMPLIANT |
| 310 | Electrical_Control_Assembly | ascent_stage_eca_1_week | SPL | CDN-CAP-0032 | AVX | C0402C475M7PACTU | COMPLIANT |
| 311 | Electrical_Control_Assembly | ascent_stage_eca_1_week | SPL | CDN-CAP-0034 | Murata | GRM155R60J225ME95L | COMPLIANT |
| 312 | Electrical_Control_Assembly | ascent_stage_eca_1_week | SPL | CDN-CAP-0036 | Murata | GRM15xxxxxxxxxxxxxx | COMPLIANT |
| 313 | Electrical_Control_Assembly | ascent_stage_eca_1_week | SPL | CDN-CAP-0038 | Murata | GRM15xxxxxxxxxxxxxx | COMPLIANT |
| 314 | Electrical_Control_Assembly | ascent_stage_eca_1_week | SPL | CDN-CAP-0039 | Murata | GRM15xxxxxxxxxxxxxx | COMPLIANT |
| 315 | Electrical_Control_Assembly | ascent_stage_eca_1_week | SPL | CDN-CAP-0115 | AVX | 08052C683KAT2A | COMPLIANT |
| 316 | Electrical_Control_Assembly | ascent_stage_eca_1_week | SPL | CDN-CAP-0172 | AVX | 08051C681KAT2A | COMPLIANT |

DESIGN DASHBOARD

| NAME | SHARED VERSION | CHECKED OUT TO | OWNERS | LABELS | CHECK IN/SAVE COMMENT |
|---|---|---|---|---|---|
| WORKING DESIGN | | | | | |
| DESCENT_STAGE_ECA | 3.0 | | KHANNA | SCHEMATIC DESIGN REVIEW | |
| SCH 1 | 1.0 | | | SCHEMATIC DESIGN REVIEW | |
| DERIVED DATA | | | | | |
| LOGICAL BOM | | | | | |
| PACKAGED | 3.0 | | | SCHEMATIC DESIGN REVIEW | |
| PHYSICAL | 1.0 | | | SCHEMATIC DESIGN REVIEW | |
| DDR_MEMORY_MID | 1.0 | | | SCHEMATIC DESIGN REVIEW | |
| DESCENT_STAGE_ECA_BRD | 1.0 | | | SCHEMATIC DESIGN REVIEW | |
| DESCENT_STAGE_ECA_6_BRD | 1.0 | | | SCHEMATIC DESIGN REVIEW | |
| PROCESSOR_RESET_TEST | 1.0 | | KHANNA | SCHEMATIC DESIGN REVIEW | |
| SCH 1 | 1.0 | | | SCHEMATIC DESIGN REVIEW | |
| SYM 1 | 1.0 | | | SCHEMATIC DESIGN REVIEW | |
| PROCESSOR_DDR_IF | 1.0 | | | SCHEMATIC DESIGN REVIEW | |
| SCH 1 | 1.0 | | | SCHEMATIC DESIGN REVIEW | |
| SYM 1 | 1.0 | | | SCHEMATIC DESIGN REVIEW | |
| DDR_MEMORY | 1.0 | | | SCHEMATIC DESIGN REVIEW | |
| SCH 1 | 1.0 | | | SCHEMATIC DESIGN REVIEW | |
| SYM 1 | 1.0 | | | SCHEMATIC DESIGN REVIEW | |
| PACKAGED | 1.0 | | | SCHEMATIC DESIGN REVIEW | |
| PHYSICAL | 1.0 | | | SCHEMATIC DESIGN REVIEW | |
| DDR_MEMORY_BRD | 1.0 | | | SCHEMATIC DESIGN REVIEW | |
| DDR_MEMORY_MID | 1.0 | | | SCHEMATIC DESIGN REVIEW | |

FIG. 21

DESIGN DASHBOARD — 2300

| NAME | SHARED VERSION | CHECKED OUT TO | OWNERS | LABELS | CHECK IN/SAVE COMMENT |
|---|---|---|---|---|---|
| WORKING DESIGN | | | | | |
| ├ DESCENT STAGE ECA | 3.0 | | KHANNA | SCHEMATIC DESIGN REVIEW | |
| │  └ SCH 1 | 1.0 | | | SCHEMATIC DESIGN REVIEW | |
| ├ DERIVED DATA | | | | | |
| │  └ LOGICAL BOM | 3.0 | | | SCHEMATIC DESIGN REVIEW | |
| ├ PACKAGED | 1.0 | | | SCHEMATIC DESIGN REVIEW | |
| ├ PHYSICAL | 1.0 | | | SCHEMATIC DESIGN REVIEW | |
| ├ DDR MEMORY MOD | 1.0 | | | SCHEMATIC DESIGN REVIEW | |
| ├ DESCENT STAGE ECA BRD | 1.0 | | | SCHEMATIC DESIGN REVIEW | |
| ├ DESCENT STAGE ECA (LBRD) | 1.0 | | KHANNA | SCHEMATIC DESIGN REVIEW | |
| ├ PROCESSOR RESET TEST | 1.0 | | | SCHEMATIC DESIGN REVIEW | |
| ├ SCH 1 | 1.0 | | | SCHEMATIC DESIGN REVIEW | |
| ├ SYM 1 | 1.0 | | | SCHEMATIC DESIGN REVIEW | |
| ├ PROCESSOR_DDR_IF | 1.0 | | | SCHEMATIC DESIGN REVIEW | |
| ├ SCH 1 | 1.0 | | | SCHEMATIC DESIGN REVIEW | |
| ├ SYM 1 | 1.0 | | | SCHEMATIC DESIGN REVIEW | |
| ├ DDR MEMORY | 1.0 | | | SCHEMATIC DESIGN REVIEW | |
| ├ SCH 1 | 1.0 | | | SCHEMATIC DESIGN REVIEW | |
| ├ SYM 1 | 1.0 | | | SCHEMATIC DESIGN REVIEW | |
| ├ PACKAGED | 1.0 | | | SCHEMATIC DESIGN REVIEW | |
| ├ PHYSICAL | 1.0 | | | SCHEMATIC DESIGN REVIEW | |
| ├ DDR MEMORY BRD | 1.0 | | | SCHEMATIC DESIGN REVIEW | |
| └ DDR MEMORY MOD | 1.0 | | | SCHEMATIC DESIGN REVIEW | |

FIG. 23

| Working Design | | | | |
|---|---|---|---|---|
| ⊟ descent_stage_eca | 17.0 | 17.0 | khanna | Schematic Design Review |
| ⊟ sch_1 | 3.0 | 3.0 | | Schematic Design Review |
| LogicalBom | 3.0 | 3.0 | | Schematic Design Review |
| packaged | 3.0 | 3.0 | | Schematic Design Review |
| ⊟ physical | 5.0 | 5.0 | | Schematic Design Review |
| ddr_memory.mdd | 1.0 | 1.0 | | Schematic Design Review |
| descent_stage_eca.brd | 1.0 | 1.0 | | Schematic Design Review |
| ⊟ descent_stage_eca_6... | 1.0 | 1.0 | | Schematic Design Review |
| ⊟ [Modules] | | | | |
| SWITCHER | | | | |
| SWITCHER | | | | |
| ⊟ processor_reset_test | 13.0 | 13.0 | khanna | Schematic Design Review |
| sch_1 | 13.0 | 13.0 | | Schematic Design Review |
| sym_1 | 2.0 | 2.0 | | Schematic Design Review |
| ⊟ processor_ddr_if | 13.0 | 13.0 | | Schematic Design Review |
| sch_1 | 13.0 | 13.0 | | Schematic Design Review |

Reset Baseline   Edit View   Gantt View   Projected View

| Title | Start Date | Due Date | Task Status | Priority | Actual Start | Actual End | Baseline Start | Baseline End |
|---|---|---|---|---|---|---|---|---|
| Component Selection | 3/1/2016 | 3/4/2016 | Completed | Normal | 3/1/2016 | 3/4/2016 | 3/1/2016 | 3/4/2016 |
| Preliminary Design Review | 3/7/2016 | 3/7/2016 | Completed | Normal | 3/7/2016 | PCB Design Review | 3/7/2016 | 3/7/2016 |
| Constraint Capture | 3/8/2016 | 3/11/2016 | Completed | Normal | 3/8/2016 | 3/11/2016 | 3/8/2016 | 3/11/2016 |
| Logic Capture | 3/14/2016 | 3/18/2016 | Deferred | Normal | Logic Capture | Logic Capture | 3/14/2016 | 3/18/2016 |
| Schematic Design Review | 3/21/2016 | 3/23/2016 | In Progress | Normal | 3/21/2016 | 3/28/2016 | 3/21/2016 | 3/23/2016 |
| PCB Placement Review | 3/24/2016 | 3/25/2016 | Not Started | Normal | Project Label is PCB Placer | Project Label is PCB Placer | 3/24/2016 | 3/25/2016 |
| SI/PI Analysis | 3/28/2016 | 3/31/2016 | Not Started | Normal | | | 3/28/2016 | 3/31/2016 |
| Constraint Update | 4/1/2016 | 4/1/2016 | Not Started | Normal | | | 4/1/2016 | 4/1/2016 |
| Pre-Route Analysis | 4/4/2016 | 4/8/2016 | Not Started | Normal | | | 4/4/2016 | 4/8/2016 |
| Post-Route Analysis | 4/11/2016 | 4/15/2016 | Not Started | Normal | | | 4/11/2016 | 4/15/2016 |
| Physical Design Review | 4/18/2016 | 4/18/2016 | Not Started | Normal | | | 4/18/2016 | 18-Apr |

Reset Baseline   Edit View   Gantt View   Projected View

| Title | Start Date | Due Date | Task Status | Priority | Actual Start | Actual End | Expected End |
|---|---|---|---|---|---|---|---|
| Component Selection | 3/1/2016 | 3/4/2016 | Completed | Normal | 3/1/2016 | 3/4/2016 | |
| Preliminary Design Review | 3/7/2016 | 3/7/2016 | Completed | Normal | 3/7/2016 | PCB Design Review | 3/7/2016 |
| Constraint Capture | 3/8/2016 | 3/11/2016 | Completed | Normal | 3/8/2016 | 3/11/2016 | |
| Logic Capture | 3/14/2016 | 3/18/2016 | Deferred | Normal | Logic Capture | Logic Capture | 3/2/2016 |
| Schematic Design Review | 3/21/2016 | 3/21/2016 | In Progress | Normal | 3/21/2016 | 3/28/2016 | |
| PCB Placement Review | 3/24/2016 | 3/25/2016 | Not Started | Normal | Project Label is PCB Placement Review | Project Label is PCB Placement Review | 3/30/2016 |
| SI/PI Analysis | 3/28/2016 | 3/31/2016 | Not Started | Normal | | | 3/31/2016 |
| Constraint Update | 4/1/2016 | 4/1/2016 | Not Started | Normal | | | 4/1/2016 |
| Pre-Route Analysis | 4/4/2016 | 4/8/2016 | Not Started | Normal | | | 4/8/2016 |
| Post-Route Analysis | 4/11/2016 | 4/15/2016 | Not Started | Normal | | | 4/15/2016 |
| Physical Design Review | 4/18/2016 | 4/18/2016 | Not Started | Normal | | | 4/18/2016 |

| Project Name | Status | Schedule Start Date | Expected End Date | Process Step | Contact |
|---|---|---|---|---|---|
| Rohtang Pass | | 9/15/2015 | 12/12/2015 | Manufacturing | E. Hillary |
| Bara-lacha | | 10/20/2015 | 6/6/2016 | Layout | T. Norgay |
| Nathu | | 12/24/2015 | 7/16/2016 | Placement | G. Leigh |

Project Manager Dashboard with ECAD projects summary

SYSTEM AND METHOD FOR MANAGING CONFIGURATION DATA ASSOCIATED WITH AN ELECTRONIC DESIGN

FIELD OF THE INVENTION

The present disclosure relates to electronic design automation, and more specifically, to a system and method for managing configuration data in an electronic design.

DISCUSSION OF THE RELATED ART

Electronic design automation (EDA) utilizes software tools that may be used in the design and analysis of numerous electronic systems such as printed circuit boards (PCBs) and integrated circuits (ICs). Every electronic design process generates data that is tool specific and that increases in size as designs become more complex. In this way design managers and project leaders are faced with challenges in managing the co-relationship between design data versions within the tools used in an electronic computer aided design ("ECAD") process.

SUMMARY

In one or more embodiments of the present disclosure, a computer-implemented method is provided. The method may include providing, using at least one processor, an electronic circuit design and generating a configuration associated with a portion of the electronic circuit design. The method may further include associating a label with the configuration at a graphical user interface and applying the configuration to at least one of a design object, a sub-design, or the electronic circuit design. The method may also include displaying the configuration and electronic design data associated with the configuration.

One or more of the following features may be included. In some embodiments, the method may include allowing a user to lock or unlock the configuration based upon, at least in part, at least one of an assigned role or a granted permission defined for an electronic circuit design project. The method may further include storing the configuration for use in a second electronic circuit design. The method may also include allowing a user to remove the configuration, delete the configuration, or move the configuration to a different version of the electronic circuit design. The method may further include determining electronic circuit design project progress based upon, at least in part, the configuration. The method may include identifying a project schedule associated with the electronic circuit design and associating one or more configuration options with a project phase change associated with an electronic circuit design project. The method may further include linking a project milestone with implementation of the configuration. The method may include determining a change to the configuration and dynamically updating the displaying of the configuration. The method may also include allowing a user to join a configuration for a design project, platform or a system based upon, at least in part, at least one of an assigned role or a granted permission defined for an electronic circuit design project. In some embodiments, any change in the project schedule for a project, a platform or a system based upon a configuration may be displayed.

In some embodiments, a computer-readable storage medium having stored thereon instructions that when executed by a machine result in one or more operations is provided. Operations may providing, using at least one processor, an electronic circuit design and generating a configuration associated with a portion of the electronic circuit design. Operations may further include associating a label with the configuration at a graphical user interface and applying the configuration to at least one of a design object, a sub-design, or the electronic circuit design. Operations may also include displaying the configuration and electronic design data associated with the configuration.

One or more of the following features may be included. In some embodiments, operations may include allowing a user to lock or unlock the configuration based upon, at least in part, at least one of an assigned role or a granted permission defined for an electronic circuit design project. Operations may further include storing the configuration for use in a second electronic circuit design and/or allowing a user to remove the configuration, delete the configuration, or move the configuration to a different version of the electronic circuit design. Operations may also include determining electronic circuit design project progress based upon, at least in part, the configuration. Operations may also include identifying a project schedule associated with the electronic circuit design and altering one or more configuration options with a project phase change associated with an electronic circuit design project.

In one or more embodiments of the present disclosure, a system is provided. The system may include a computing device having at least one processor configured to receive an electronic circuit design and to generate a configuration associated with a portion of the electronic circuit design. The at least one processor may be further configured to associate a label with the configuration at a graphical user interface. The at least one processor may be further configured to apply the configuration to at least one of a design object, a sub-design, or the electronic circuit design. The at least one processor may be further configured to display one or more configurations and electronic design data associated with the one or more configurations.

One or more of the following features may be included. In some embodiments, the at least one processor may be further configured to allow a user to lock or unlock the configuration based upon, at least in part, at least one of an assigned role or a granted permission defined for an electronic circuit design project. The at least one processor may be further configured to store the configuration for use in a second electronic circuit design.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

FIG. 5 is a diagram depicting aspects of the parts list process in accordance with an embodiment of the present disclosure;

FIG. 6 is a diagram depicting aspects of the parts list process in accordance with an embodiment of the present disclosure;

FIG. 9 is a diagram depicting aspects of the parts list process in accordance with an embodiment of the present disclosure;

FIG. 10 is a diagram depicting aspects of the parts list process in accordance with an embodiment of the present disclosure;

FIG. 16 is a diagram depicting aspects of the parts list process in accordance with an embodiment of the present disclosure;

FIG. 18 is a diagram depicting aspects of the parts list process in accordance with an embodiment of the present disclosure;

FIG. 21 is a diagram depicting aspects of the configuration process in accordance with an embodiment of the present disclosure;

FIG. 23 is a diagram depicting aspects of the configuration process in accordance with an embodiment of the present disclosure;

FIG. 24 is a diagram depicting aspects of the configuration process in accordance with an embodiment of the present disclosure;

FIG. 25 is a diagram depicting aspects of the configuration process in accordance with an embodiment of the present disclosure;

FIG. 26 is a diagram depicting aspects of the configuration process in accordance with an embodiment of the present disclosure;

FIG. 27 is a diagram depicting aspects of the configuration process in accordance with an embodiment of the present disclosure;

FIG. 30 is a diagram depicting aspects of the KPI process in accordance with an embodiment of the present disclosure;

FIG. 34 is a diagram depicting aspects of the KPI process in accordance with an embodiment of the present disclosure.

DETAILED DESCRIPTION

Figure 1:
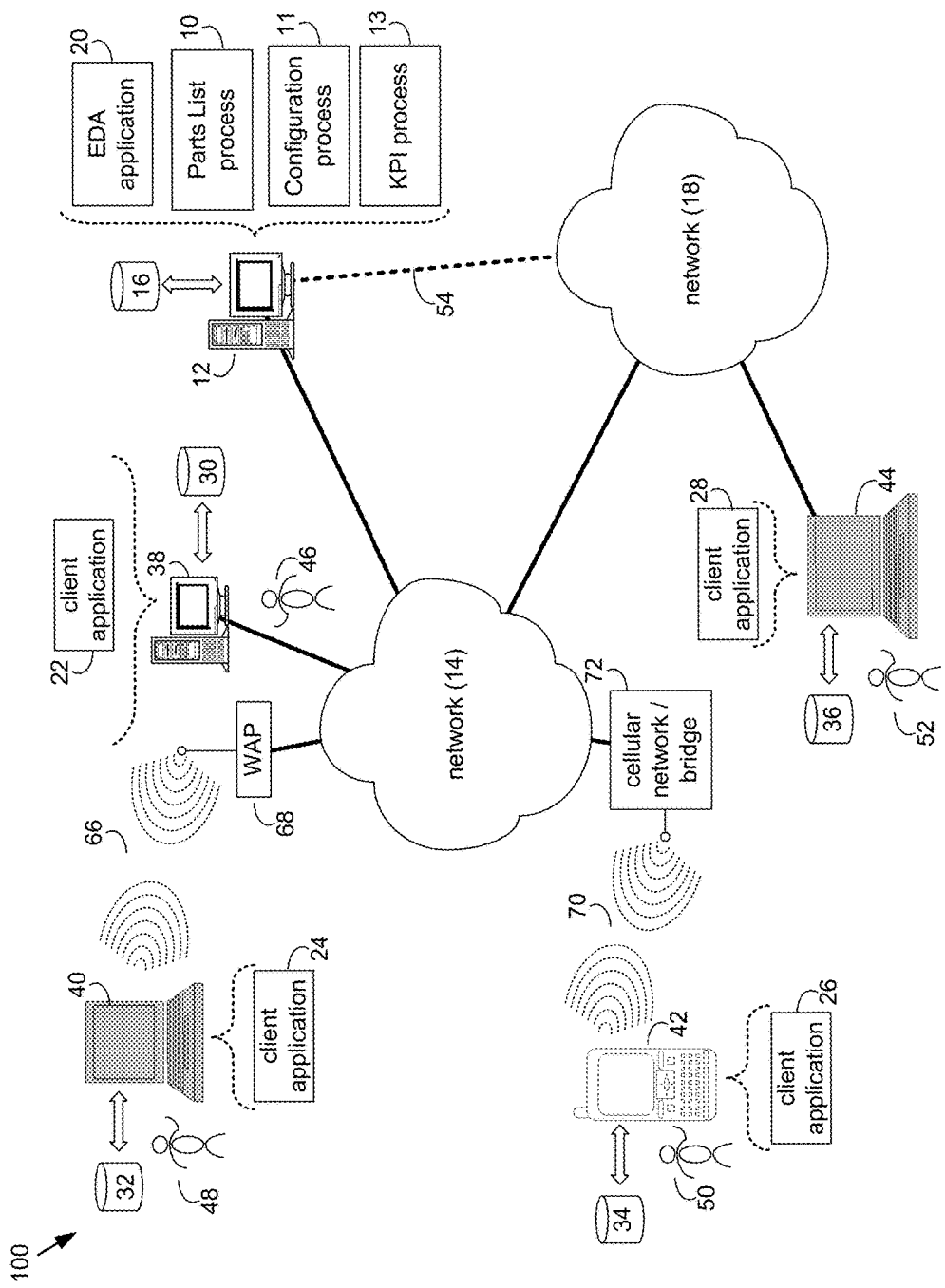
FIG. 1 is a system diagram depicting aspects of the parts list process in accordance with an embodiment of the present disclosure.

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations of the present disclosure may be written in an object oriented programming language such as Java, Smalltalk, C++ or the like. However, the computer program code for carrying out operations of the present disclosure may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present disclosure is described below with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

Referring to FIG. 1, a number of processes that may reside on and may be executed by server computer 12, which may be connected to network 14 (e.g., the Internet or a local area network) are provided. Embodiments of the present disclosure are directed towards a parts list process 10, configuration process 11, and key performance indicator process 13, each of which is discussed in further detail hereinbelow. Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell® NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally/alternatively, the processes described herein may reside on and be executed, in whole or in part, by a client electronic device, such as a personal computer, notebook computer, personal digital assistant, or the like.

The instruction sets and subroutines of processes 10, 11, and 13, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive; a RAID array; a random access memory (RAM); and a read-only memory (ROM). Storage device 16 may include various types of files and file types including but not limited, to hardware description language ("HDL") files, which may contain the port type descriptions and executable specifications of hardware blocks.

Server computer 12 may execute a web server application, examples of which may include but are not limited to: Microsoft IIS, Novell Webserver™, or Apache® Web server, that allows for HTTP (e.g., HyperText Transfer Protocol) access to server computer 12 via network 14 (Web server is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20), examples of which may include, but are not limited to those available from the assignee of the present application. EDA application 20 may interact with one or more EDA client applications (e.g., EDA client applications 22, 24, 26, 28). EDA application 20 may be referred to herein as a design tool.

Each of processes 10, 11, and 13 may be a stand alone application, or may be an applet/application/script that may interact with and/or be executed within EDA application 20. In addition/as an alternative to being a server-side process, the processes 10, 11, and 13 may be a client-side process (not shown) that may reside on a client electronic device (described below) and may interact with an EDA client application (e.g., one or more of EDA client applications 22, 24, 26, 28). Further, the processes 10, 11, and 13 may be a hybrid server-side/client-side process that may interact with EDA application 20 and an EDA client application (e.g., one or more of client applications 22, 24, 26, 28). As such, the processes 10, 11, and 13 may reside, in whole, or in part, on server computer 12 and/or one or more client electronic devices.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize processes 10, 11, and 13.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18. Further, server computer 12 (e.g., the computer that executes EDA application 20) may be connected to network 14 through secondary network 18, as illustrated with phantom link line 54.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (e.g., WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11x specifications may use Ethernet protocol and carrier sense multiple access with collision avoidance (e.g., CSMA/CA) for path sharing. The various 802.11x specifications may use phase-shift keying (e.g., PSK) modulation or complementary code keying (e.g., CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows, Microsoft Windows CE®, Red Hat Linux, or other suitable operating system. (Windows CE is a registered trademark of Microsoft Corporation in the United States, other countries, or both.).

Figure 2:
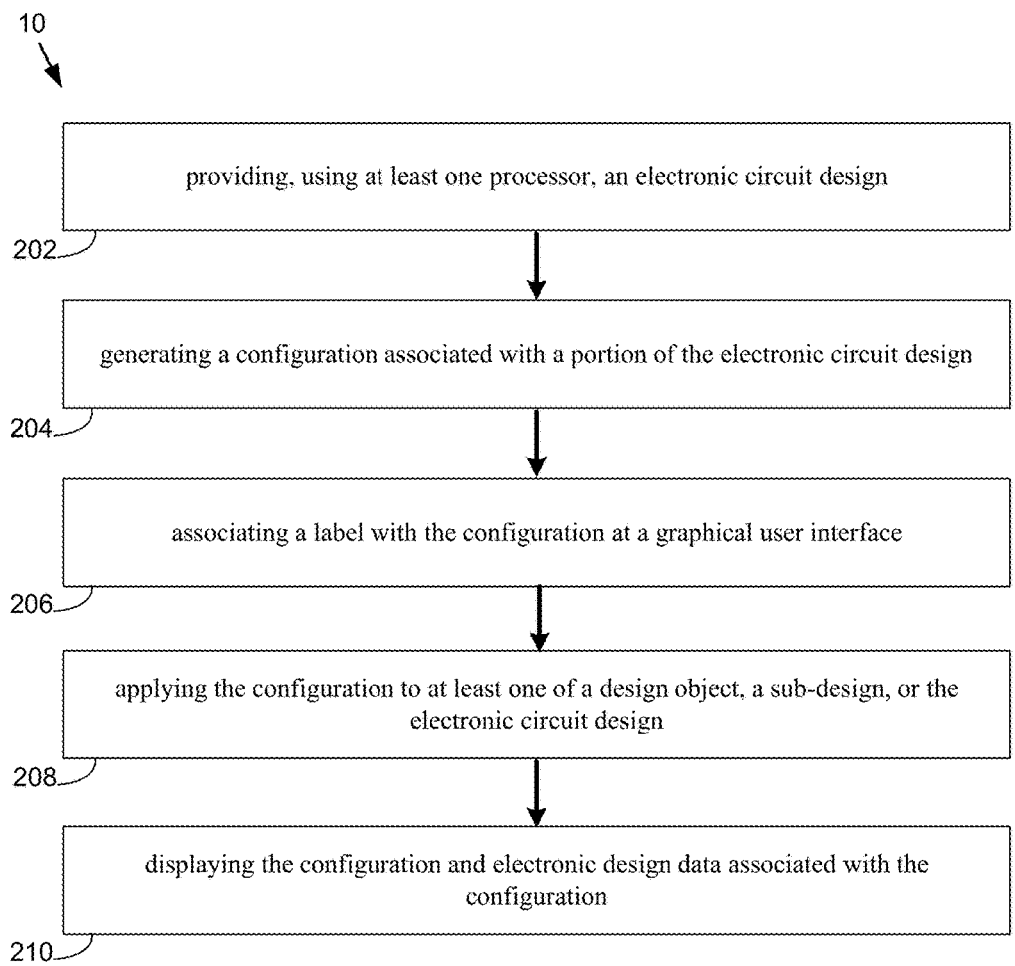
FIG. 2 is a flowchart depicting operations consistent with the configuration process of the present disclosure.

Referring now to FIG. 2, an embodiment of configuration process 10 is provided. The process may include providing (202), using at least one processor, an electronic circuit design. The process may further include generating (204) a configuration associated with a portion of the electronic circuit design and/or associating (206) a label with the configuration at a graphical user interface. The process may also include applying (208) the configuration to at least one of a design object, a sub-design, or the electronic circuit design. The process may further include displaying (210) the configuration and electronic design data associated with the configuration.

The phrase "Parts List" as used herein, may refer to an input at the start of an electronic circuit design process. The parts list may specify all of the logical and physical parts associated with the electronic design and it may be used to drive manufacturing and business processes. In some embodiments, the parts list may be generated manually or derived from an existing design.

Customers typically want to be able to start the design process from a Strategic Part Lists ("SPL") based upon preferred parts criteria for a company. As such, customers want to view and track any deviations to an optimized list of parts during the course of the design process. They want the SPL and any changes thereof to be reviewed and signed-off by component and procurement engineers early in the design cycle so that any necessary design changes can be made.

Accordingly, embodiments of parts list process 10 described herein may be configured to allow for the creation of the Strategic Parts List before the design starts and have that list of parts reviewed and approved. In this way, the SPL, once approved, becomes the list of parts that can be used in creating the design. Every time the electronic design is changed, it may be possible to see the differences between the SPL and the list of parts used in the design.

In some embodiments, the SPL may be stored in a database associated with the design and may be managed as a design entity in the design process. Embodiments of parts list process 10 may be configured to support the ability to create complete stand alone portable SPLs for reuse purposes. Additionally and/or alternatively, parts list process 10 may encourage the use of predefined project parts and may ensure closer adherence to the company preferred parts list.

In some embodiments, parts list process 10 may provide and/or receive an initial electronic circuit design. As is discussed in further detail below, parts list process 10 may be configured to generate and/or receive an initial parts list configured to include at least one of logical parts and physical parts associated with the initial electronic circuit design.

Figure 3:
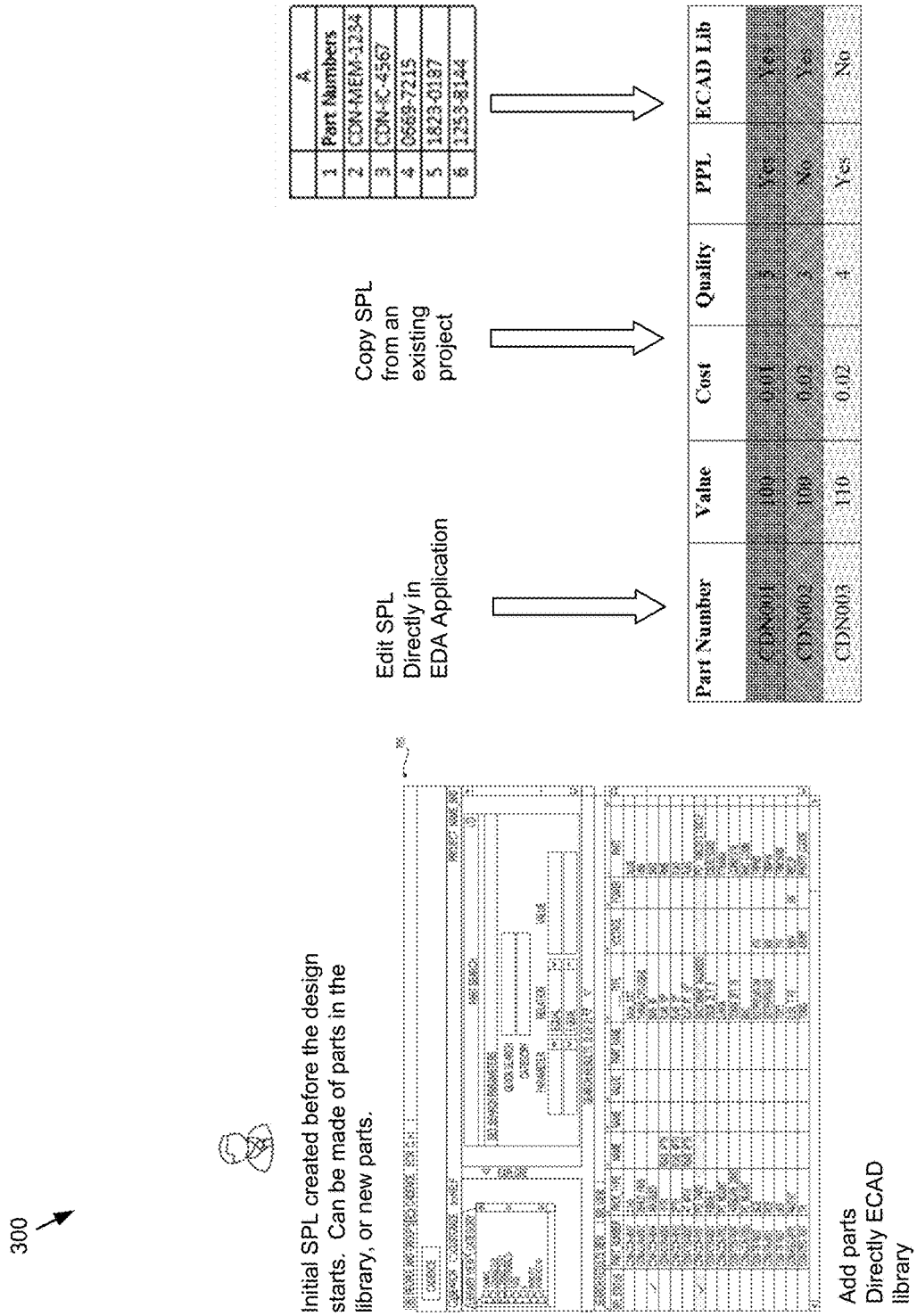
FIG. 3 is a diagram depicting aspects of the parts list process in accordance with an embodiment of the present disclosure.

Referring now to FIG. 3, embodiments of parts list process 10 may allow for generation of an SPL using a number of different techniques. Some of these may include, but are not limited to, generating the SPL prior to initiating the electronic design process (e.g. this initial SPL may be constructed of parts in an electronic computer aided design ("ECAD") library, new parts, etc.), editing the SPL directly using a tool such as EDA application 20, copying the an SPL from an existing project, and/or adding parts directly from the ECAD library, which may be stored, for example, within a storage device such as storage device 16 shown in FIG. 1.

In some embodiments, a parts list may include any suitable information pertaining to a particular part. For example, the part number, value, cost, quality, PPL, whether or not the part is located in an ECAD library, etc.

Figure 4:
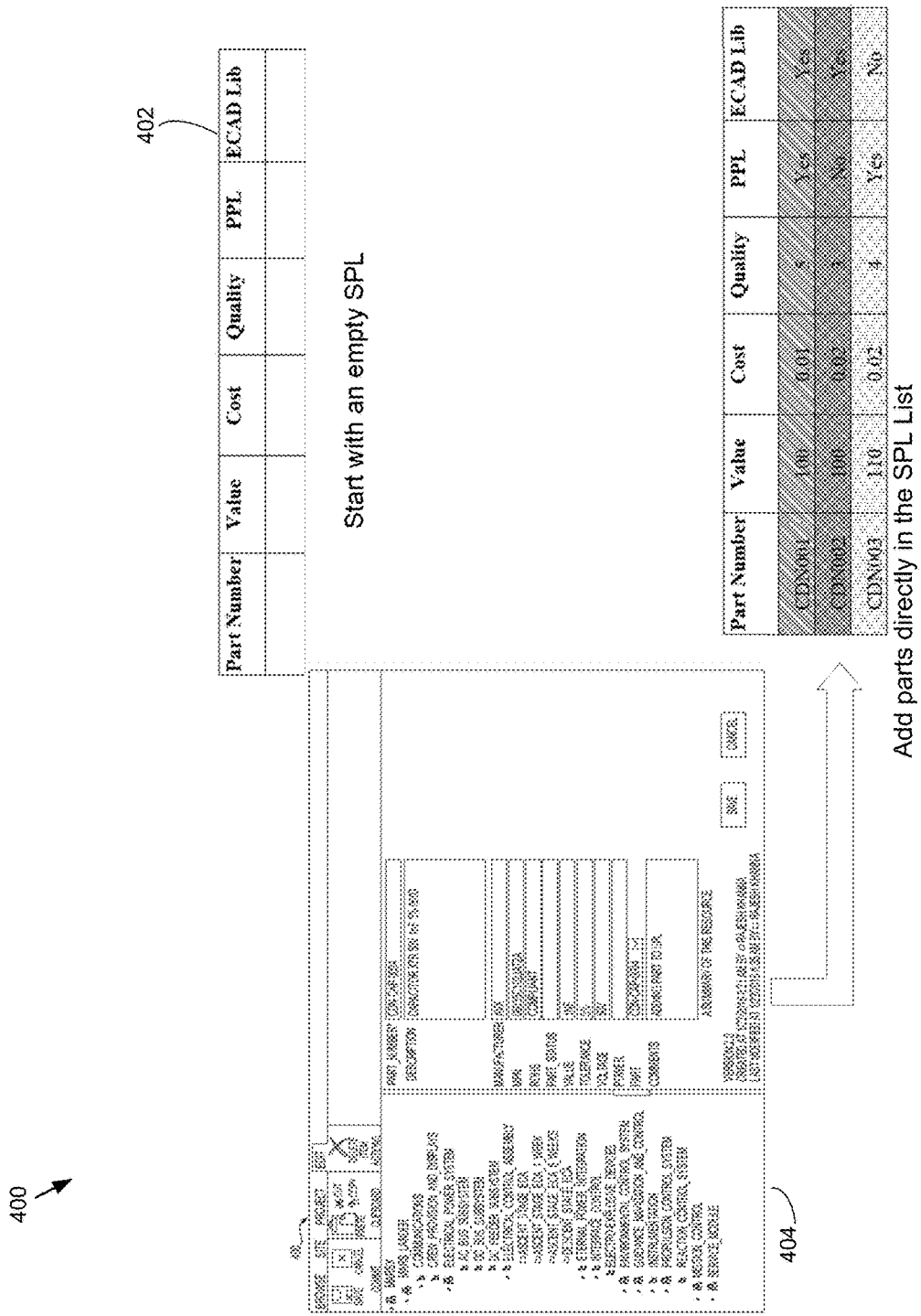
FIG. 4 is a diagram depicting aspects of the parts list process in accordance with an embodiment of the present disclosure.

Referring now to FIG. 4, an embodiment of parts list process 10 depicting a graphical user interface 400 is provided. In this particular example, an SPL may be edited directly using a tool such as EDA application 20. As shown in the Figure, the initial SPL may be empty but parts that are already associated with EDA application 20 may be added. For example, graphical user interface 402 may be associated with EDA application 20 and may include various information pertaining to the stored part. Some of this information may include, but is not limited to, the part number, a description of the part, manufacturer information, RoHS compliance, MPN, part status, value, tolerance, voltage, power, comments, etc. This information may be stored for reuse using any suitable approach.

Figure 5:
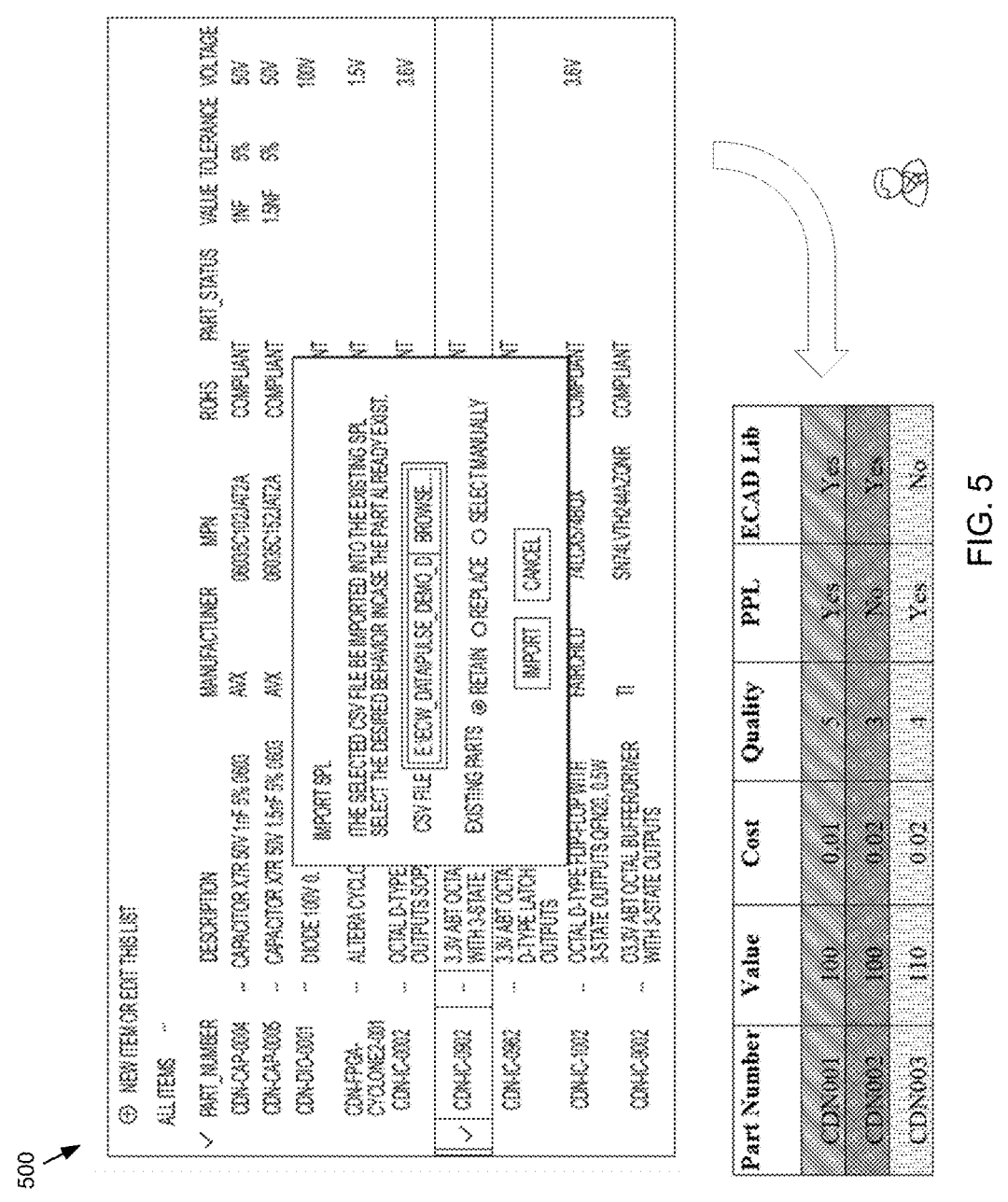

Referring now to FIG. 5, an embodiment of parts list process 10 depicting a graphical user interface 500 is provided. Parts list process 10 may be configured to store the updated parts list and provide the updated parts list to a second electronic design. In this particular example, an SPL may be copied from an existing project. As is shown in the Figure, the user may be provided with an option of selecting one or more files for insertion. Additionally and/or alternatively, the user may be provided with the option of retaining the existing parts, replacing some or all of the parts, and/or manually selecting the desired parts.

Figure 6:
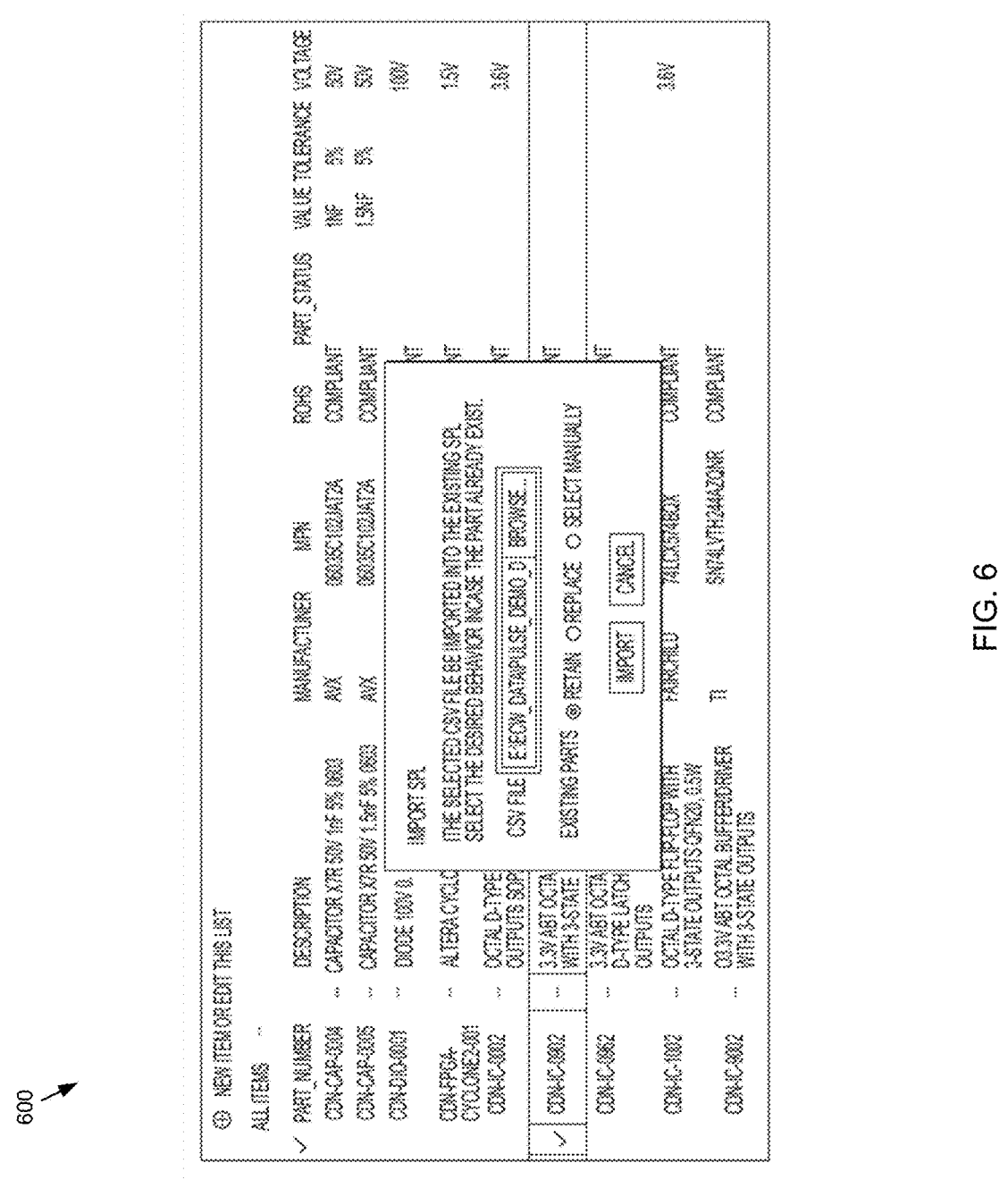

Referring now to FIG. 6, an embodiment of parts list process 10 depicting a graphical user interface 600 is provided. In this particular example, an SPL may be imported from a file. It should be noted that although a .csv file is depicted in this example any suitable file may be used without departing from the scope of the present disclosure. Parts list process 10 may provide the user with an option to edit the initial parts list, which may include any suitable operation, some of which may include, but are not limited to, adding a part to the initial parts list and/or deleting a part to the initial parts list. Receiving an update to the parts list may also include altering a characteristic of an existing part associated with the initial parts list.

Figure 7:
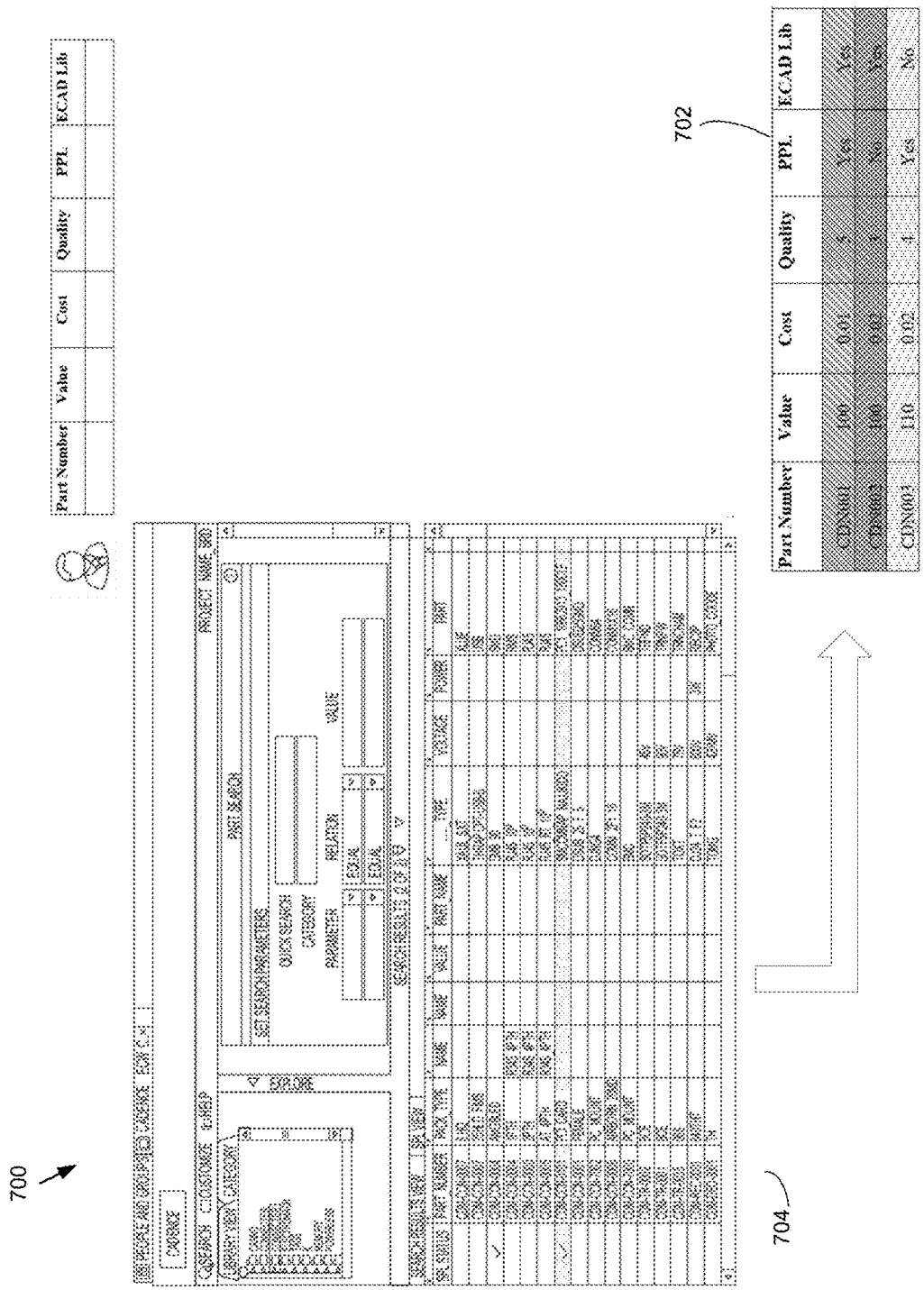
FIG. 7 is a diagram depicting aspects of the parts list process in accordance with an embodiment of the present disclosure.

Referring now to FIG. 7, an embodiment of parts list process 10 depicting a graphical user interface 700 is provided. In this particular example, an SPL may be generated using parts from an ECAD library 702 associated with EDA application 20. This may be performed using any suitable approach, for example, using a component browser tool available via EDA application 20.

Figure 8:
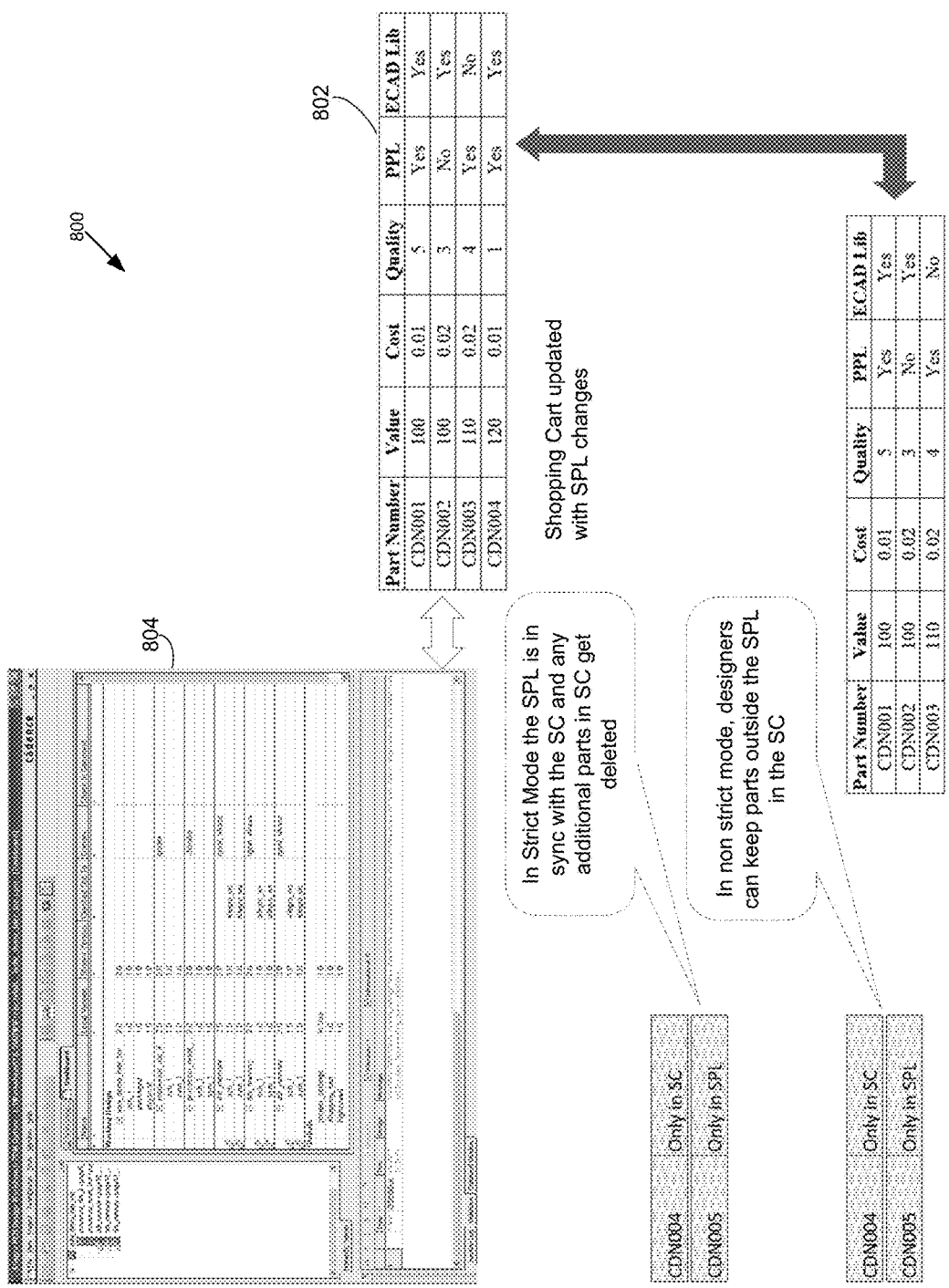
FIG. 8 is a diagram depicting aspects of the parts list process in accordance with an embodiment of the present disclosure.

Referring now to FIG. 8, an embodiment of parts list process 10 depicting a design update using approved parts is provided. In this particular embodiment, parts list process 10 may allow a user to apply a strict-mode or a non-strict-mode. This may operate as a user-selectable option that may trigger a strict mode or a non-strict mode. In some embodiments, the strict mode option may allow for a display of only the updated parts list within the shopping cart. For example, in the strict-mode the SPL 802 may be in synchronization with the shopping cart ("SC") 804 and any additional parts in SC 804 may be deleted. In some embodiments, SC 804 may be accessible via EDA application 20. In the non-strict-mode, a user may keep parts that are outside of the SPL 802 within SC 804. One example of this is shown in FIG. 8 with reference to part number "CDN004" and "CDN005".

Figure 9:
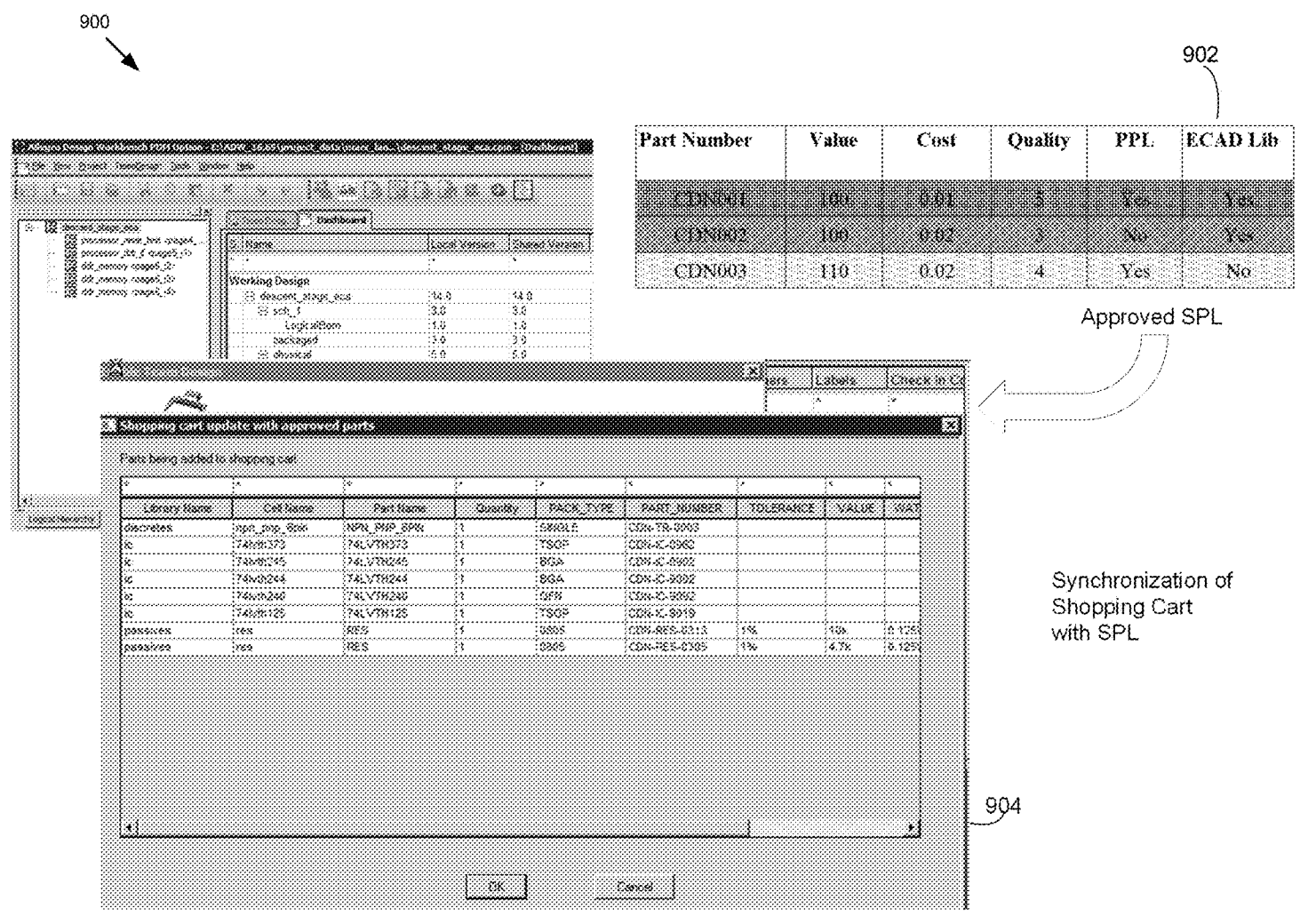

Referring now to FIG. 9, an embodiment of parts list process 10 depicting a design update showing a synchronization with the design process is provided. In this particular embodiment, an approved SPL 902 may be synchronized with SC 904. SC 904 may include various types of information some of which may include, but is not limited to, the updated parts list, a library name, a cell name, a part name, a quantity, a package type, a part number, a tolerance, a value, etc. This list is merely provided by way of example and is not intended to limit the scope of the present disclosure.

Referring now to FIG. 10, an embodiment of parts list process 10 depicting an example of an external parts list that may be integrated with corporate enterprise resource planning ("ERP"), MRP, etc. is provided. Accordingly, additional up-to-date part information may be shared and/or updated from the external system.

Figure 11:
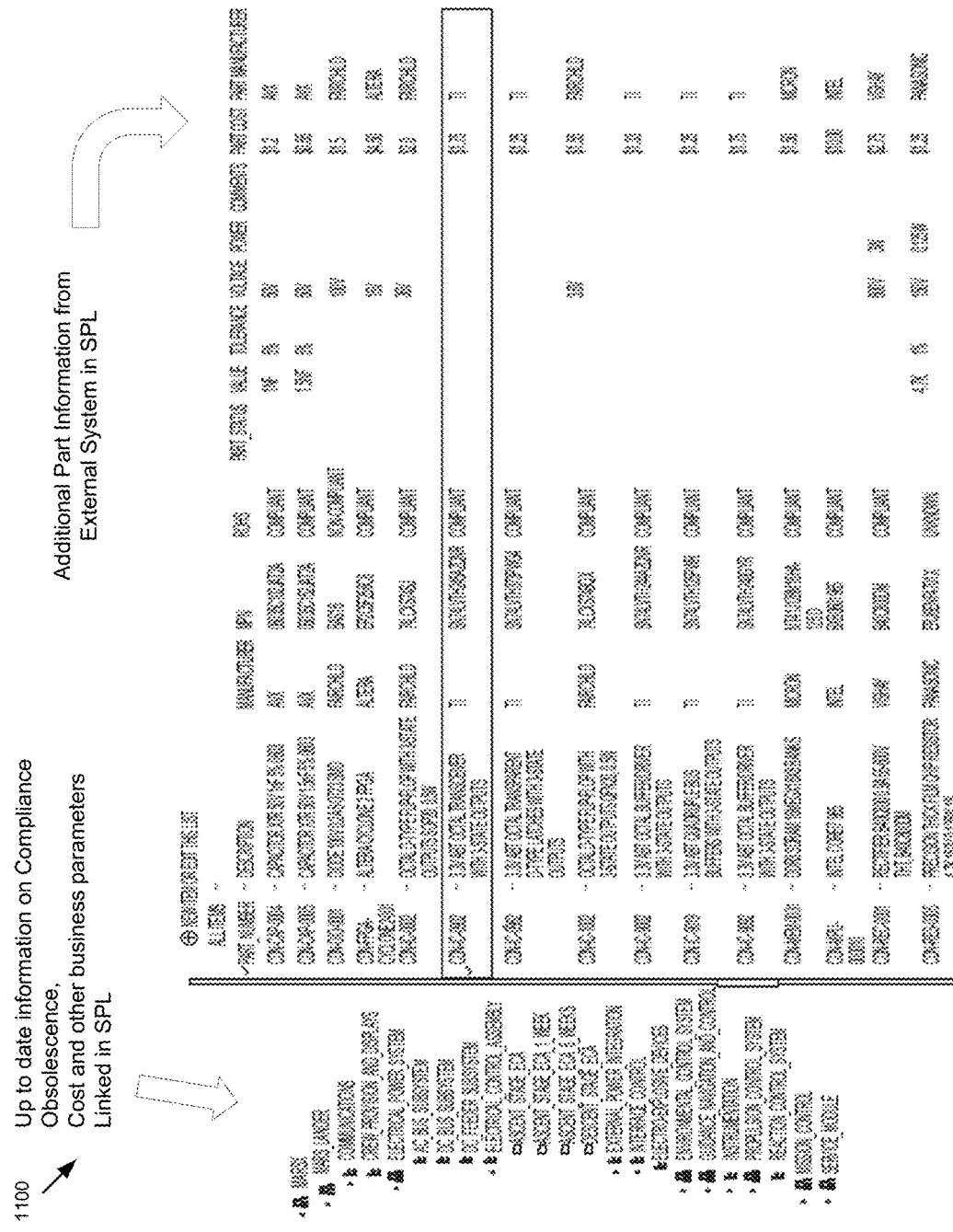
FIG. 11 is a diagram depicting aspects of the parts list process in accordance with an embodiment of the present disclosure.

Referring now to FIG. 11, an embodiment of parts list process 10 depicting an one example of parts list integration is provided. In this particular example, additional part information may be uploaded from an external system. In this example, the "part cost" column has been updated using information from the external list. Additionally and/or alternatively, up-to-date information on compliance, obsolescence, cost, and other business parameters may be linked to the SPL.

Figure 12:
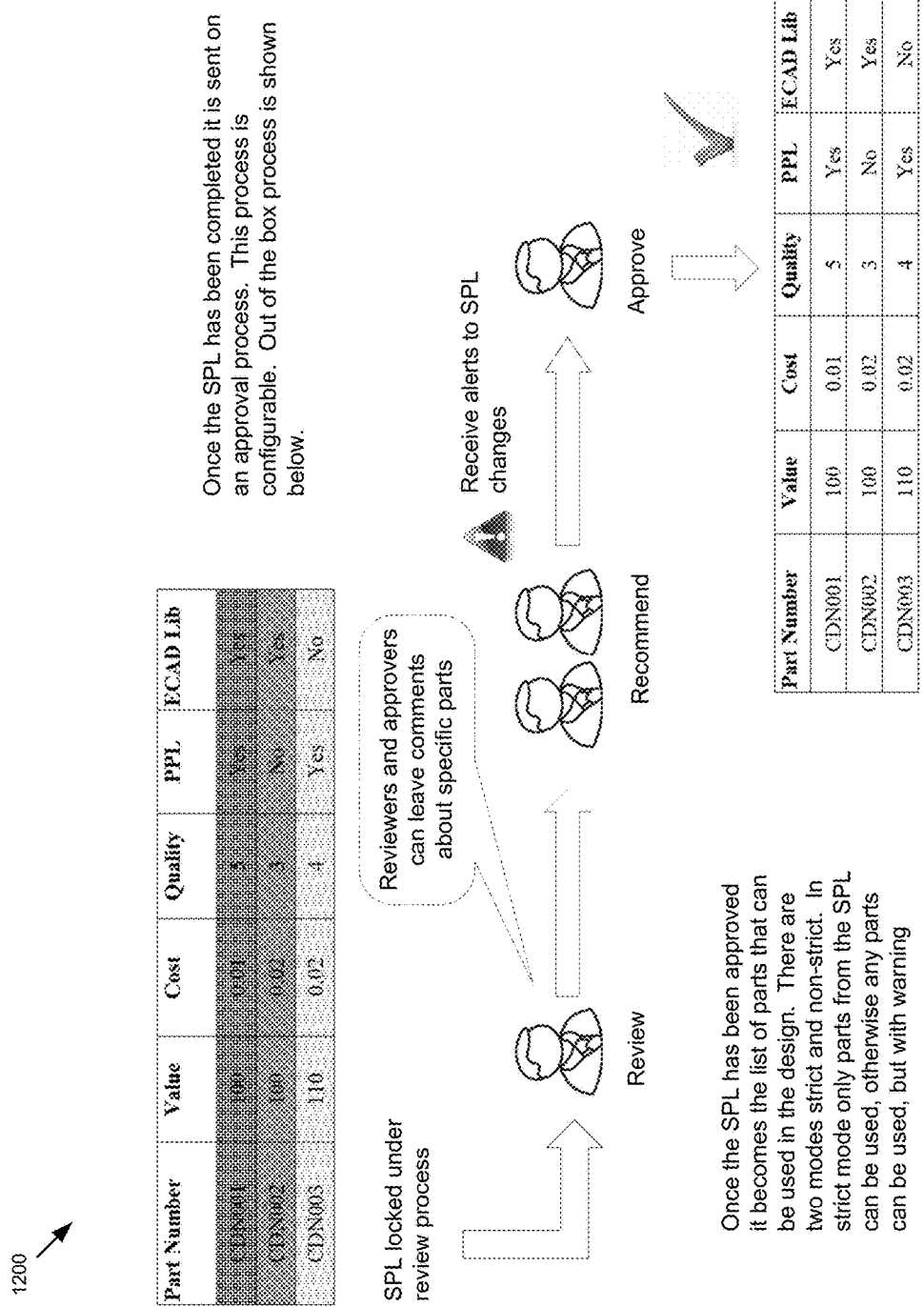
FIG. 12 is a diagram depicting aspects of the parts list process in accordance with an embodiment of the present disclosure.

Referring now to FIG. 12, an embodiment of parts list process 10 depicting one or more stages of an SPL approval process is provided. In some embodiments, generating the updated parts list may be based upon, at least in part, a configurable approval process. In operation, once the SPL has been completed it may be sent out for an approval process. In some embodiments, this process may be configurable based upon one or more user-determined options. During the review process the SPL may be locked (e.g. disabling revisions to the electronic design during editing of the initial parts list) and reviewers and approvers may leave comments about specific parts. If any changes have been recommended and approved an alert may be transmitted indicating the same. Once the SPL has been approved it becomes the list of parts that may be used in the electronic design. As discussed above, parts list process 10 allows for the use of a variety of different modes of use, including, but not limited to, strict-mode and non-strict-mode. In strict-mode only parts from the SPL may be used. In non-strict-mode any parts may be used, however, a warning may be provided.

Figure 13:
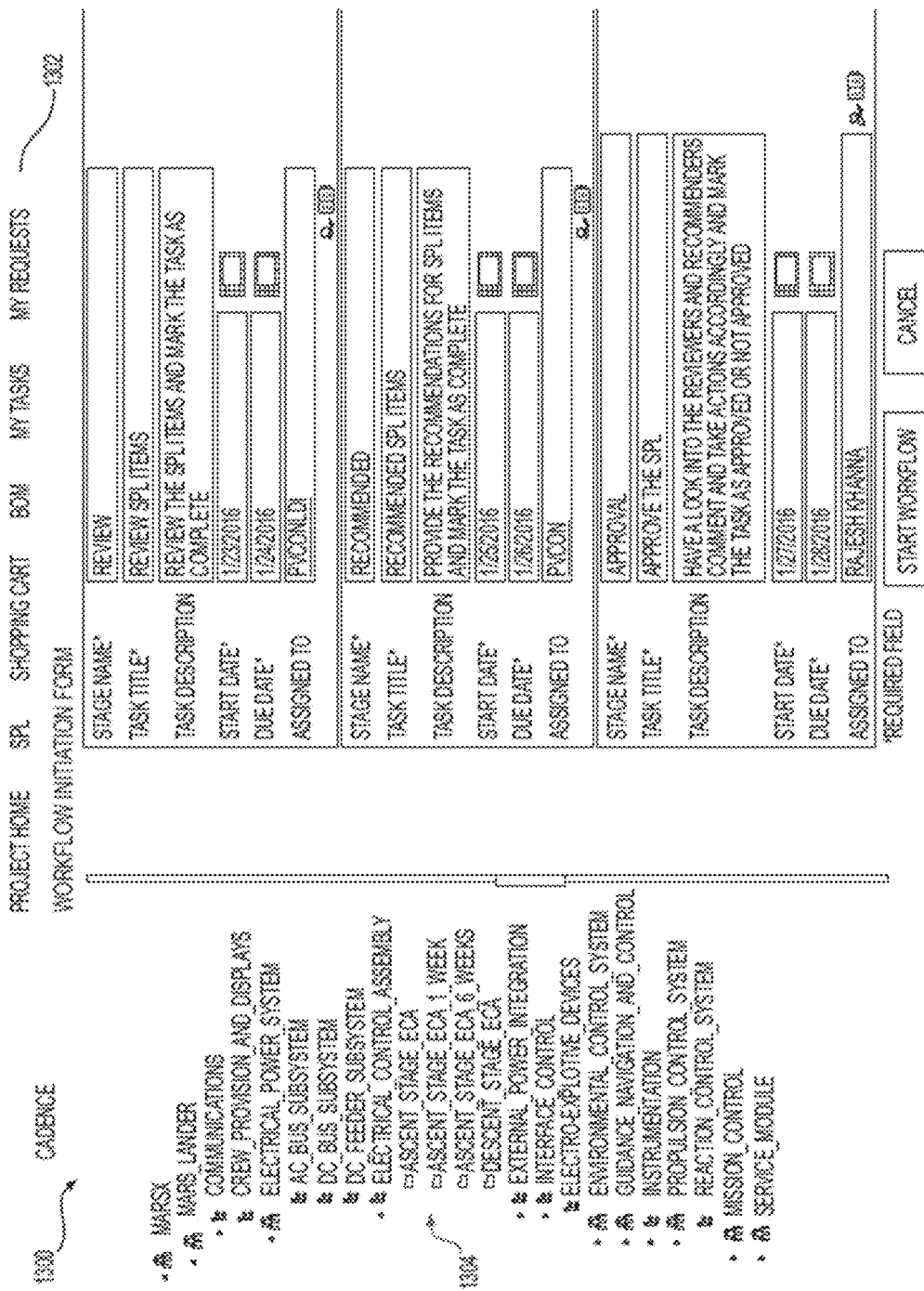
FIG. 13 is a diagram depicting aspects of the parts list process in accordance with an embodiment of the present disclosure.

Referring now to FIG. 13, an embodiment of parts list process 10 depicting a graphical user interface 1300 including a workflow initiation form 1302 is provided. In some embodiments, parts list process 10 may be configured to provide authorization to one or more users to edit the initial parts list via graphical user interface 1300. In some cases, the authorized set of users may be a subset of all possible users. Parts list process 10 may be configured to receive an update to the initial parts list from the one or more users a graphical user interface and to generate an updated parts list based upon, at least in part, the update.

Referring again to FIG. 3, workflow initiation form 1302 shows one particular example that may be used to initiate an SPL review cycle. In some embodiments, workflow initiation form 1302 may be accessed via a hierarchical menu 1304 as is depicted in FIG. 13. The workflow initiation form depicts three distinct stages, namely review, recommend, and approval. As is shown in the Figure, each stage may have a start and end date associated therewith. Additionally and/or alternatively, each stage may be assigned to a particular designer and each designer may have a distinct task that they have been asked to perform.

Figure 14:
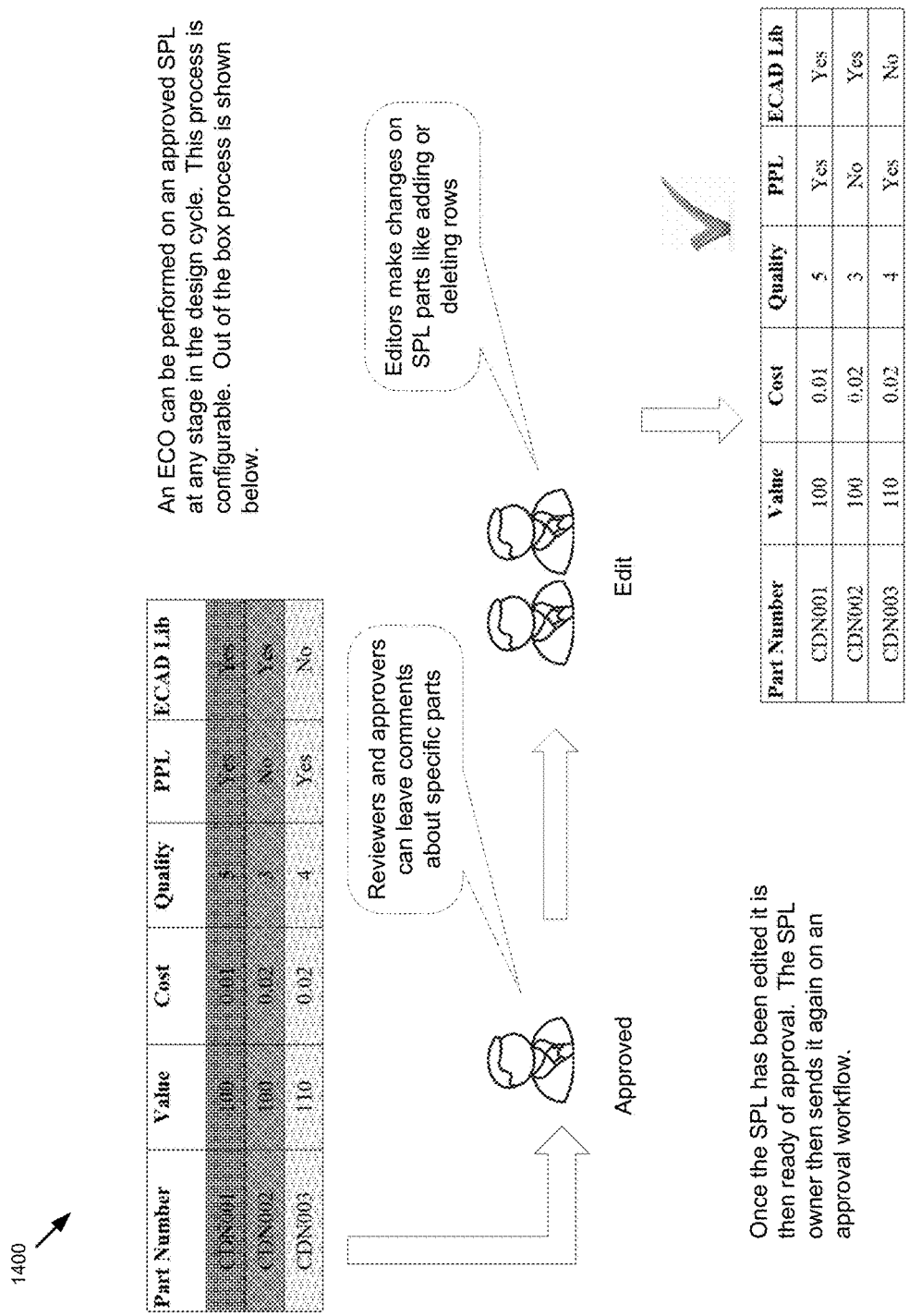
FIG. 14 is a diagram depicting aspects of the parts list process in accordance with an embodiment of the present disclosure.

Referring now to FIG. 14, an embodiment of parts list process 10 showing one example process for implementing an engineering change order ("ECO") is provided. An ECO may be performed on an approved SPL at any stage in the design cycle and it may be user-configurable if desired. In operation, an SPL owner may change the SPL from an approved state to an edit state and may assign one or more component engineers for editing. Editors may make changes on SPL parts such as adding or deleting rows. Once the SPL has been edited it is then ready for approval. The SPL owner may then send it again on an approval workflow.

Figure 15:
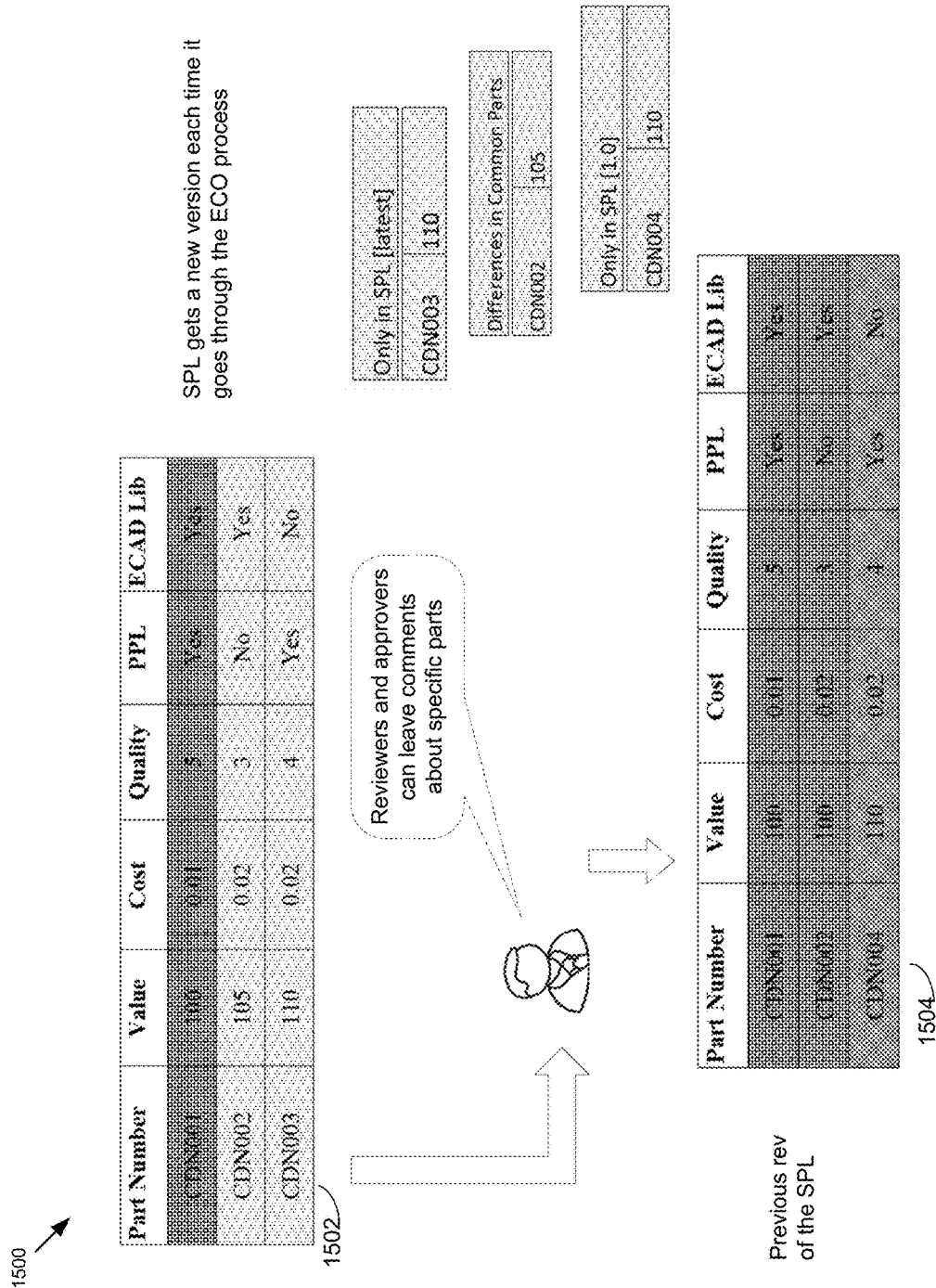
FIG. 15 is a diagram depicting aspects of the parts list process in accordance with an embodiment of the present disclosure.

Referring now to FIG. 15, embodiments of parts list process 10 may be configured to store different versions of an SPL. Accordingly, in some embodiments an SPL may generate a new version each time it undergoes an ECO process. In this way, user may choose to view the differences between one or more versions of an SPL. As such, graphical user interface 1500 may be configured to display differences in the SPL from one version to another (e.g. a current version 1502 in contrast with a previous version 1504).

Referring now to FIG. 16, an embodiment of parts list process 10 depicting SPL differences within graphical user interface 1600 is provided. In the particular example shown in GUI 1600 the differences in SPLs from two projects for process adherence are depicted. For example, list1 may be labeled with a color that differs from list2 two and the corresponding text within the table may match that color. Here, the list1 text color may be red and the list2 text color may be blue so that the differences are readily apparent to the user at the graphical user interface.

Figure 17:
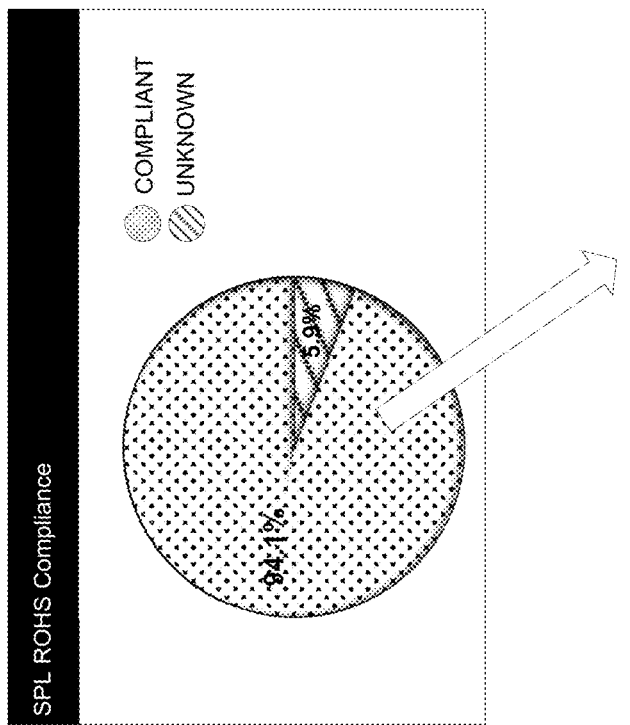
FIG. 17 is a diagram depicting aspects of the parts list process in accordance with an embodiment of the present disclosure.

Referring now to FIG. 17, an embodiment of parts list process 10 depicting an SPL web part showing its compliance status is provided. In this embodiment, graphical user interface 1700 may be displayed, which may allow a user to review the SPL in a charting widget, or any suitable form, for configurable properties. Some of these may include, but are not limited to, compliance, obsolescence, etc. In this particular embodiment, a pie chart shows that 94.1% ROHS compliance has been achieved. Additionally and/or alternatively, parts list process 10 may allow the user to select portions of the display in order to obtain further information. Here, the user may want to see exactly what portions of the SPL data are non-compliant. Thus, upon selection of a portion of the pie chart, graphical user interface 1700 may be configured to display the non-compliant SPL data as is shown in sub-view display 1702.

Referring now to FIG. 18, an embodiment of parts list process 10 depicting a graphical user interface 1800 is provided. GUI 1800 may be configured to display SPLs from a plurality of different projects with conditional formatting for a consolidated system view. In this way, GUI 1800 may display workspace information, project information, list information, part numbers, manufacturer information, MPN, and ROHS information.

Referring now to FIGS. 19-27 embodiments of a configuration process 11 consistent with the teachings of the present disclosure are provided. Embodiments of configuration process 11 may include providing an electronic circuit design and generating a configuration associated with a portion of the electronic circuit design. Embodiments of configuration process 11 may further include associating a label with the configuration at a graphical user interface and applying the configuration to at least one of a design object, a sub-design, or the electronic circuit design. Embodiments of configuration process 11 may also include displaying the configuration and electronic design data associated with the configuration. Each of these is discussed in further detail hereinbelow.

An ECAD Design Process often generates data that may be tool specific and this data is increasing in size as designs increase in complexity. Design managers and project leaders face a huge challenge in managing co-relations among various design data versions within tools and also among various tools that are used in an ECAD process. Accordingly, designers want a solution that enables an easy methodology for managing the co-relation among various design objects. In this way, embodiments of configuration process 11 may be configured to support the ability to apply a configuration to a design object, a sub design or a complete design. Additionally and/or alternatively, embodiments of configuration process 11 may create and configure the tags for driving a configuration. In some embodiments, various design objects may be viewed in a configuration and the designer may also have the ability to use a configuration as a start of a design.

An ECAD Design Process Lifecycle typically includes one or more key phases. Design Managers and Project Leaders want to enable tracking progress on a project throughout the design process. They want feedback in real time and linked tightly with the design process based upon baseline project schedules. They want to link the phases or configurations in a design process to project schedules and monitor project overruns. Accordingly, embodiments of configuration process 11 described herein address each of these issues, as is discussed in further detail hereinbelow.

In some embodiments, configuration process 11 may be used to create and apply custom configuration(s) to align with various key phases in the design process. Accordingly, configuration process 11 may allow the ability to lock and unlock configuration based upon roles and permission defined for a design project. In this way, embodiments of configuration process 11 may allow a user to view the various configurations with the associated data attached to a configuration.

In some embodiments, the user may be provided with an option to define a configuration between various objects, a sub design and/or a complete design. Accordingly, configuration process 11 may provide the ability to recover a complete design and/or sub design based upon an applied configuration for reuse. In this way, configuration process 11 may encourage the use of configurations to mitigate risk and provide accuracy to the design data as it is released to the manufacturing process.

In some embodiments, configuration process 11 may support management of a configuration. For example, and as is shown in FIGS. 19-27, configuration process 11 may allow the user to remove a configuration, delete a configuration from the system and/or move a configuration to a different version of the design. Additionally and/or alternatively, configuration process 11 may provide the ability to use a configuration to track projects schedules and report delays as the design progresses.

In some embodiments, configuration process 11 may be used to create project schedules and also create, apply and/or lock custom configuration(s) to align with various key phases or gates in the design process. Embodiments of configuration process 11 may provide the ability to use a configuration to track projects schedules and report delays as the design progresses. Users have the ability to configure project schedules and link them to various configurations or gates in a design process. In this way, each time a configuration changes, the project schedules may be updated and reflect the change.

Figure 19:
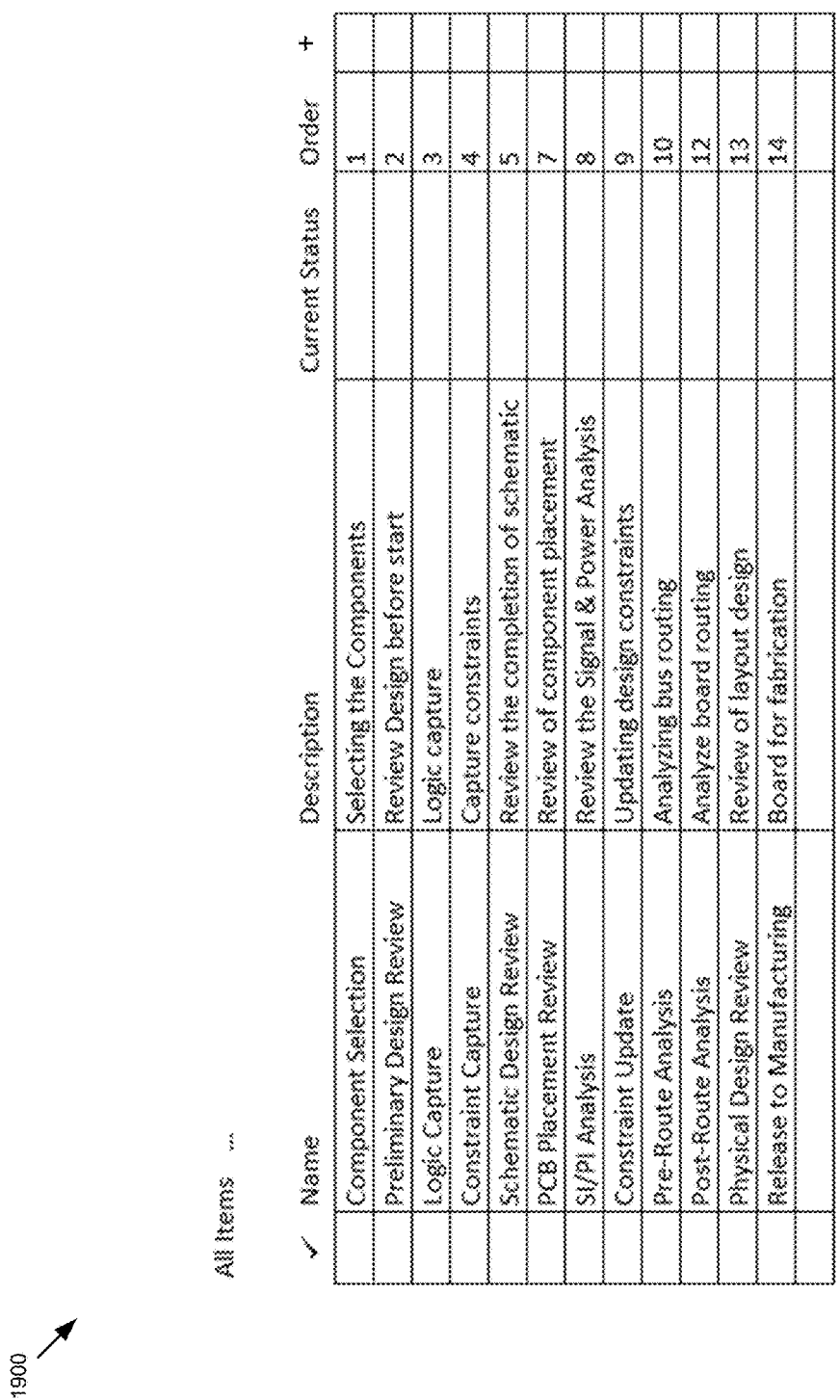
FIG. 19 is a diagram depicting aspects of the configuration process in accordance with an embodiment of the present disclosure.

Referring now to FIG. 19, an embodiment of configuration process 11 depicting a graphical user interface 1900 is provided. In this particular example, GUI 1900 shows one example for generating or creating one or more tags for a configuration. Accordingly, in some embodiments, a user may create custom tags in the system, which may be used globally throughout the design. GUI 1900 includes a number of different fields, in this example, "name", "description", "current status", and "order" fields. These are provided merely by way of example. Each user may select one or more tags that may be used for their project from the set of global tags. In some embodiments, the tags may match the phases or milestones in the design project and the system may be configured to track the usage of the tags in the system using any suitable technique. For example, using configuration process 11, EDA application 20, combinations therebetween, and/or any other approach.

Figure 20:
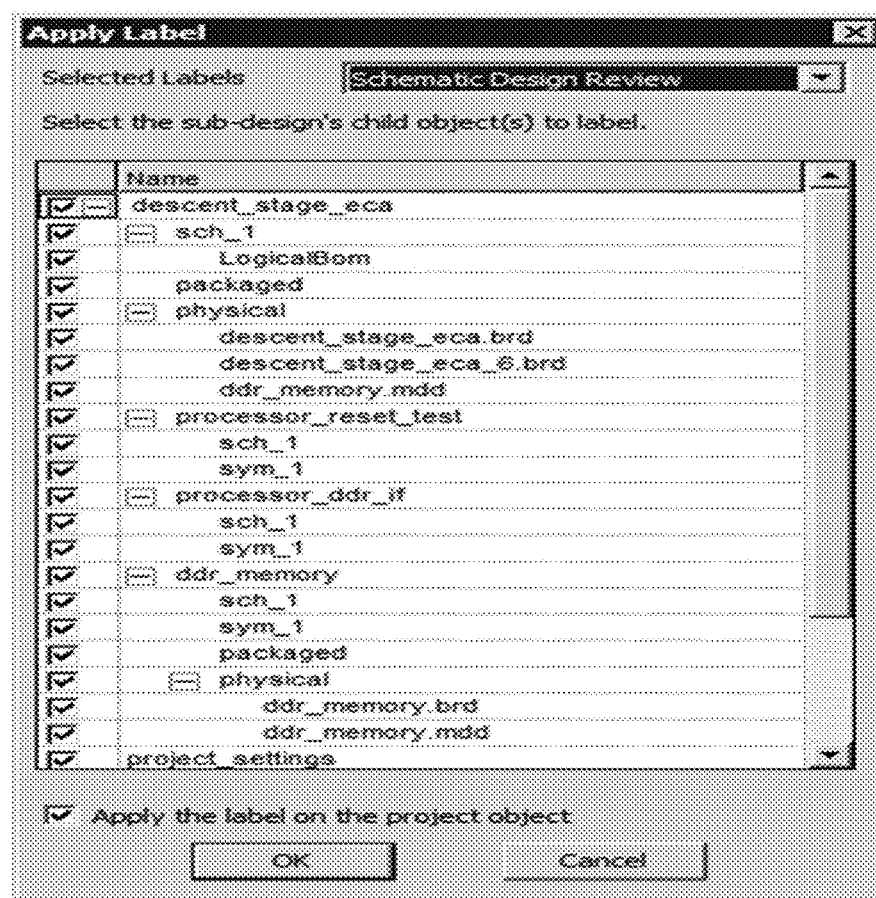
FIG. 20 is a diagram depicting aspects of the configuration process in accordance with an embodiment of the present disclosure.

Referring now to FIG. 20, an embodiment of configuration process 11 depicting a GUI 2000 is provided. GUI 2000 depicts one possible example by which a user may apply a configuration. GUI 2000 shows a particular label, in this example, "Schematic Design Review", which may have a number of user-selectable sub-design/child objects that may be labeled at the designer's discretion.

It should be noted that designers or design managers may apply a configuration in a variety of different ways. Some of these may include, but are not limited to, applying a configuration to an entire system, to an entire project, to a sub design in a project, and/or to a design object in a system or a project. Additionally and/or alternatively, configuration process 11 may allow a user to apply multiple configurations over time of a project. In some embodiments, the same configuration may be applied over time, which may result in the configuration moving from earlier objects to new objects.

In some embodiments, configuration process 11 may maintain the integrity for the design and the relationships to the various objects. When users apply the configuration to a design, the sub design elements may be automatically chosen on the configuration. If the configuration is applied only to a sub-design, the high level design that uses the sub-design elements are not chosen automatically. When multiple design objects are chosen for applying a configuration and if they share any common object, it may be selected by configuration process 11. The user may choose to add other optional elements into the configuration as well.

Referring now to FIG. 21, an embodiment of configuration process 11 depicting a GUI 2100 is provided. GUI 2100 depicts one possible example by which a user may view a configuration. In some embodiments, some or all of the design objects that make up the configuration for the system or a project may be shown to the user. The version differences from the latest objects may also be displayed for the user. In the design dashboard shown in FIG. 21 a hierarchical display is provided. The name of the design, design objects, sub-groups, version, check out information, owner, label, comments, etc. may all be displayed and may be searchable by the user.

Figure 22:
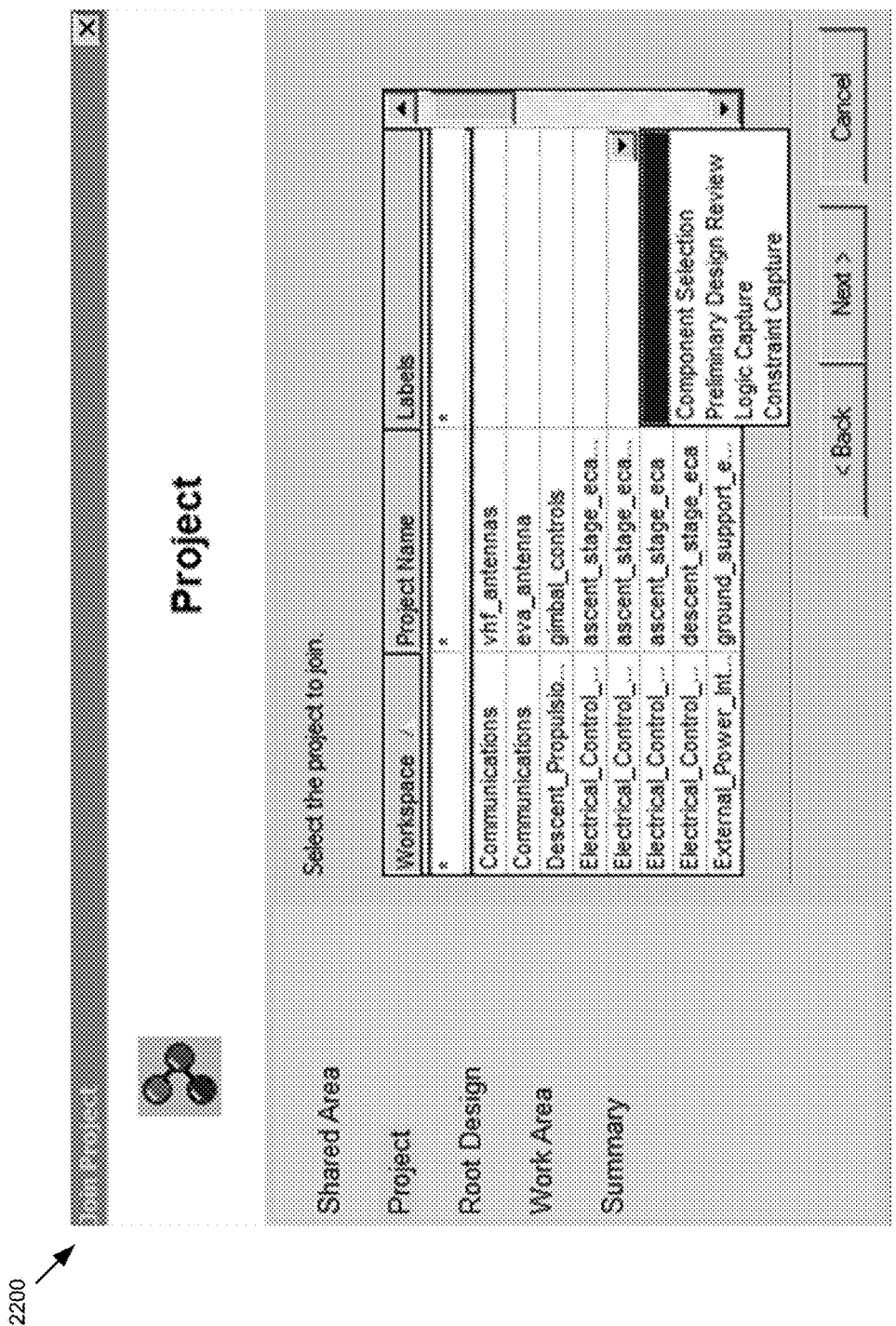
FIG. 22 is a diagram depicting aspects of the configuration process in accordance with an embodiment of the present disclosure.

Referring now to FIG. 22, an embodiment of configuration process 11 depicting a GUI 2200 is provided. GUI 2200 depicts one possible mechanism by which a user may be able to retrieve a particular system and/or project configuration. In some embodiments, some or all project configurations are shown to the user. The configuration may be used to start a new design and/or to alter the existing design in an ECO process.

Referring now to FIG. 23 an embodiment of configuration process 11 depicting a GUI 2300 is provided. Configuration process 11 may include allowing a user to lock or unlock the configuration based upon, at least in part, at least one of an assigned role or a granted permission defined for an electronic circuit design project. In this way, GUI 2300 depicts one possible mechanism by which a user may lock a particular configuration. Accordingly, a user having the requisite permission may be able to lock a configuration within a system or a design project. Configuration process 11 may allow a user to lock multiple configurations over time. In some embodiments, the configurations may be time-based and/or milestone driven.

Referring now to FIG. 24 an embodiment of configuration process 11 depicting a GUI 2400 is provided. GUI 2400 depicts one possible mechanism by which a user may un-lock a particular configuration. Accordingly, a user with permission can unlock a configuration within a system or a design project. In some embodiments, the unlocked configuration may be further deleted and/or moved to incorporate the correct versions for objects.

Referring now to FIG. 25 an embodiment of configuration process 11 depicting a GUI 2500 is provided. GUI 2500 depicts an embodiment that illustrates how a designer may utilize configuration process 11 during project planning. In some embodiments, a user may be provided with the ability to configure project schedules and link them to various configurations and/or gates in a design process. Various project activities may be mapped to different configurations for planning purposes. Users, via configuration process 11, may also use configurations to trigger both start and end dates for a planned activity.

Referring now to FIG. 26 an embodiment of configuration process 11 depicting a GUI 2600 is provided. GUI 2600 depicts an embodiment of configuration process 11 showing one example of project tracking that may be used in accordance with the teachings of the present disclosure. Each time a configuration changes, the project schedules may be updated and reflect the change. The actual completion dates for a gate may now be linked to the project.

Referring now to FIG. 27 an embodiment of configuration process 11 depicting a GUI 2700 is provided. GUI 2700 depicts an example of a project manager dashboard that includes an ECAD projects summary report. Accordingly, GUI 2700 may allow a user to monitor possible project overruns as well as numerous other issues. Accordingly, a user may be provided a project status and overruns in the project summary page. In some embodiments, the project schedules may be tracked for each phase and delays may be reported as the design progresses. The expected completion date may also be provided in near real time. As is shown in GUI 2700 the dashboard may include, but is not limited to, project name, status, start date, end date, process step, contact information, etc. The status may be color-coded thus providing immediate feedback regarding job completion (e.g. red, yellow, green, etc.). Accordingly, embodiments of configuration process 11 may identify a project schedule associated with the electronic circuit design and allow for alteration of one or more configuration options with a project phase change associated with an electronic circuit design project. As shown and described herein, embodiments of configuration process 11 may also include linking a project milestone with implementation of the configuration and/or determining a change to the configuration and dynamically updating the displaying of the configuration.

The ECAD Design Process Lifecycle has numerous key phases and gates. Design managers and project leaders want to enable tracking and collaboration throughout the design process. They also want to ensure that checks and balances are put in place to monitor progress and avoid schedule overruns. They want feedback that is real-time and linked tightly with the design process using key performance indicators ("KPIs"). They want a configurable solution that can be adapted based upon the type of design in progress and the ability to work on different patterns for different customers. They want a solution that supports the ability to create complete stand alone portable indicators for reuse purposes. The solution should be manageable at a product level or as a sub-design. Embodiments of KPI process 13 address each of these issues and is discussed in further detail hereinbelow.

Referring now to FIGS. 28-34 embodiments of a KPI process 13 consistent with the teachings of the present disclosure are provided. Embodiments of KPI process 13 may be used to create custom patterns from templates to align with various key phases in the design process. In some embodiments, the KPIs may operate on user-defined custom rules on process and design metrics issues specific to a project and roll up summaries to provide dashboard information. The user may be provided with an option to create and/or customize KPIs for different data sources. Some of these may include, but are not limited to, design metrics, library metrics, component data integrated from external systems, etc. The KPIs may provide the user with near real-time information as the design progresses so they can see the variation in the actual and the goal and also see the deltas therebetween.

In some embodiments, KPI process 13 may be configured to provide the ability to create complete stand-alone portable indicators for reuse purposes. KPI process 13 may encourage the use of dashboards to mitigate risk and provide process improvements for releasing a design to manufacturing.

In some embodiments, KPI process 13 may allow for collection of various metrics. Metrics are intended to provide a way of collecting data around the work-in-progress ("WIP") projects. KPI process 13 may be configured to collect metrics from system projects and design projects. In some embodiments, the system administrators may configure the system to collect the metrics as per a customer requirements. KPI process 13 may be configured to track and display the changes in the metrics over time of the system or a project. Table 1 provided below depicts various examples of metrics that may be used in accordance with the present disclosure.

TABLE 1

| Metrics Group | Metrics Sub Group | Title | Name |
|---|---|---|---|
| Constraint | NetClass | NumberElectrical | Electrical Nets |
| Constraint | NetClass | NumberPhysical | Physical Nets |
| Constraint | NetClass | NumberSpacing | Spacing Nets |
| Constraint | NetClass | NumberSameNetSpacing | Same Spacing Nets |
| Constraint | Others | NumberCSets | Constraint Sets |
| Constraint | Others | NumberECSets | Electrical Constraint Sets |
| Constraint | Others | NumberMatchGroups | Match Groups |
| Constraint | Others | NumberSCSets | Spacing Constraint Sets |
| Constraint | Others | NumberNetGroups | Net Groups |
| Constraint | Others | NumberPCSets | Physical Constraint Sets |
| Constraint | Others | NumberSNSCSets | Same Net Spacing Constraint Sets |
| FrontEnd | Connectivity | NumberDiffPairs | Differential Pairs |
| FrontEnd | Connectivity | NumberNets | Total Nets |
| FrontEnd | Connectivity | NumberUnconnectedPins | Unconnected Pins |
| FrontEnd | DRC | DRCStatus | Logical DRC Status |
| FrontEnd | Others | GroundNets | Ground Nets |
| FrontEnd | Others | NumberActive | Active Components |
| FrontEnd | Others | NumberComponents | Components on Schematic |
| FrontEnd | Others | NumberConnectors | Connectors |
| FrontEnd | Others | NumberDiscretes | Discretes |
| FrontEnd | Others | NumberXNets | XNets |
| FrontEnd | Others | PackagerStatus | Packager Status |
| FrontEnd | Others | PowerNets | Power Nets |
| Physical | Design | BoardThickness | Board Thickness |
| Physical | Design | Embedded | Embedded Components |
| Physical | Design | HDI | HDI Board |
| Physical | Design | NumberComps | Components in Layout |
| Physical | Design | NumberStandardDrills | Standard Drills |
| Physical | Design | NumberNonStandardDrills | Non Standard Drills |
| Physical | Design | NumberLayers | Number of Layers |
| Physical | Design | NumberPassives | Passive Components |
| Physical | Design | NumberUnplacedComps | Unplaced Components |
| Physical | Design | NumberVias | Total Vias |
| Physical | Design | RatsDensity | Rats Density |
| Physical | Design | RoutedNets | Routed Nets |
| Physical | Design | SmallestDrill | Smallest Drill |
| Physical | Design | UnroutedNets | Unrouted Nets |
| Physical | DRC | DRC | Layout DRCs |
| Physical | DRC | WaivedDRC | Waived DRCs |

TABLE 1-continued

| Metrics Group | Metrics Sub Group | Title | Name |
| --- | --- | --- | --- |
| Physical | Design | RouteKeepinArea | Route Keepin Area |
| Process | NetRev | NumberNetins | Netins Count |
| Process | Others | CurrentFlowStep | Current Flow Step |
| Process | Others | StepStatus | Current Flow Step Status |
| Process | Others | ProjectLabelApplied | Project Label |
| Process | Others | ProjectLabelRemoved | Label Removed from Project |
| Process | Others | ProjectLabelLocked | Locked Label |
| Process | Others | ProjectLabelUnlocked | Unlocked Label |
| Process | Others | ProjectLabelObsolete | Obsolete Label |
| Process | Packaging | NumberChangedNets | Number of ECO in last Netin |

Figure 28:
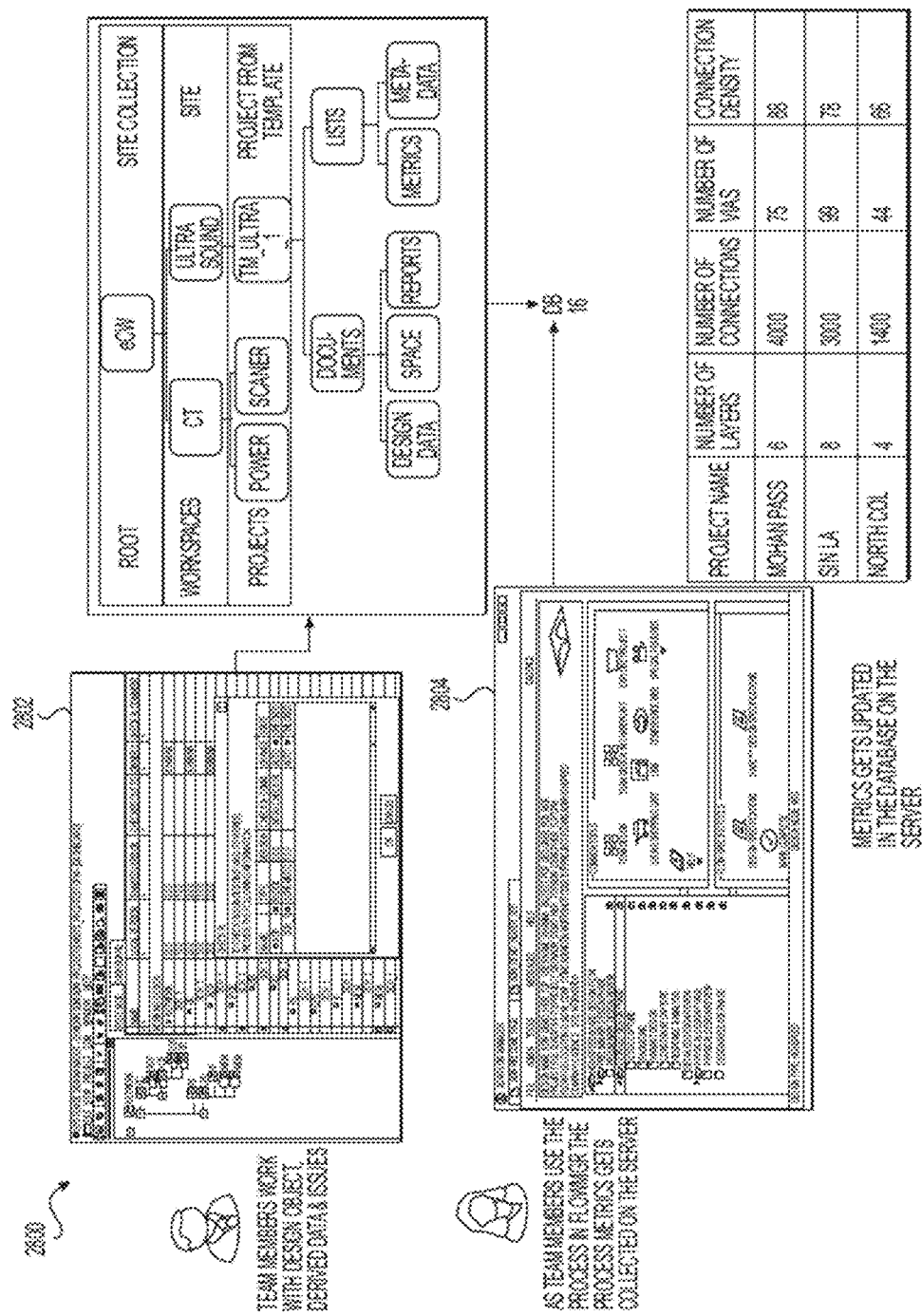
FIG. 28 is a diagram depicting aspects of the KPI process in accordance with an embodiment of the present disclosure.

Referring now to FIG. 28, an embodiment of KPI process 13 depicting an example of metrics collection is provided. In operation, team members may work with design objects, derived data and various issues using a graphical user interface such as GUI 2802. GUI 2802 may provide a mechanism for the user to check-in a design, sub-design, views, etc. As team members may access some or all of this process using any suitable approach such as EDA application 20, which may be configured to display numerous graphical user interfaces such as GUI 2804. GUI 2804 may be used to receive and transfer one or more process metrics for collection on a server such as server computing device 12.

Figure 29:
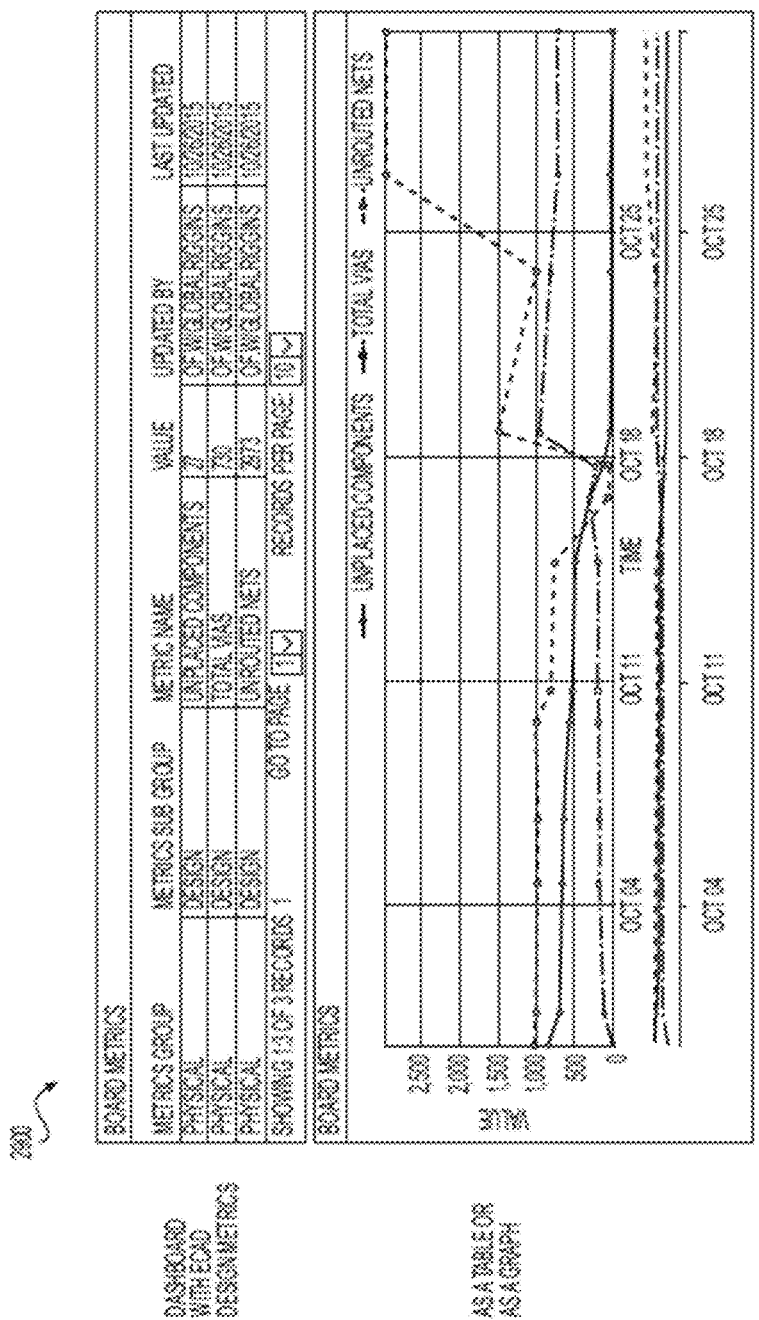
FIG. 29 is a diagram depicting aspects of the KPI process in accordance with an embodiment of the present disclosure.

Referring now to FIG. 29, an embodiment of KPI process 13 depicting an example for displaying ECAD design metrics is provided. As is shown in the example GUI 2900, the metrics may be displayed using any suitable approach, some of which may include, but are not limited to, tables, graphs, lists, charts, etc. Individual users may customize the display and also choose the metrics of interest to them. GUI 2900, for example, shows various board metrics, which may be displayed as groups and sub-groups and may include metrics name, value, the name of the user who last updated the metrics, the date of the update, etc. Embodiments of KPI process 13 may be configured to display all changes as they occur over time to the user.

Figure 30:
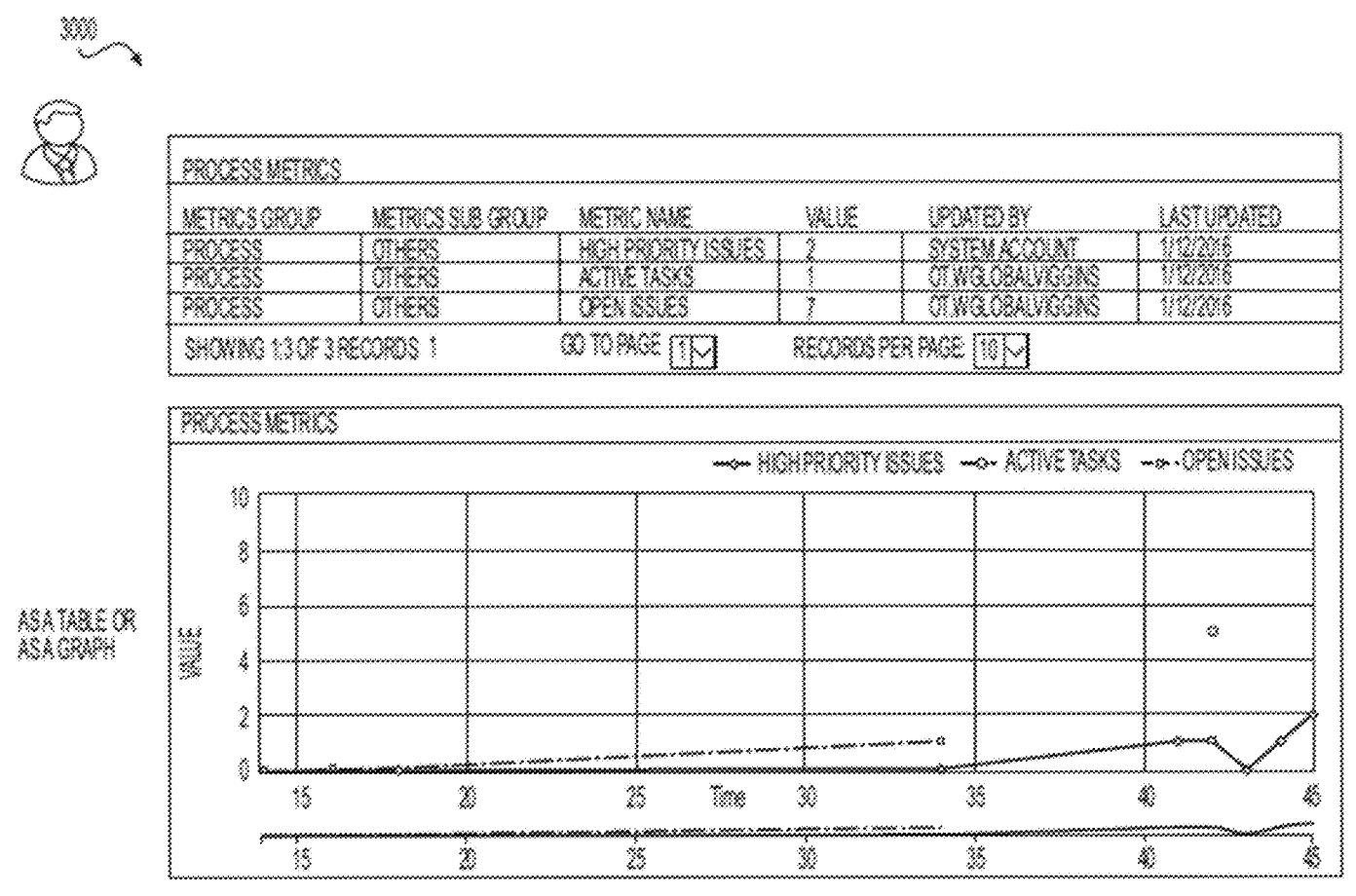

Referring now to FIG. 30, an embodiment of KPI process 13 depicting an example for displaying ECAD process metrics is provided. As is shown in the example GUI 3000, the metrics may be displayed using any suitable approach similar to those described above in relation to the design metrics.

Figure 31:
FIG. 31 is a diagram depicting aspects of the KPI process in accordance with an embodiment of the present disclosure.

Referring now to FIG. 31, an embodiment of KPI process 13 depicting an example for generating and creating custom metrics is provided. Accordingly, in some embodiments users may create custom metrics in the system, which may be defined using the base metrics that are captured by the system. Custom metrics may be added to user configurable groups or subgroups. In some embodiments the custom metrics may be supported globally for the system or locally for a project. GUI 31 depicts one possible example of an interface that may be used in accordance with the teachings of the present disclosure.

Figure 32:
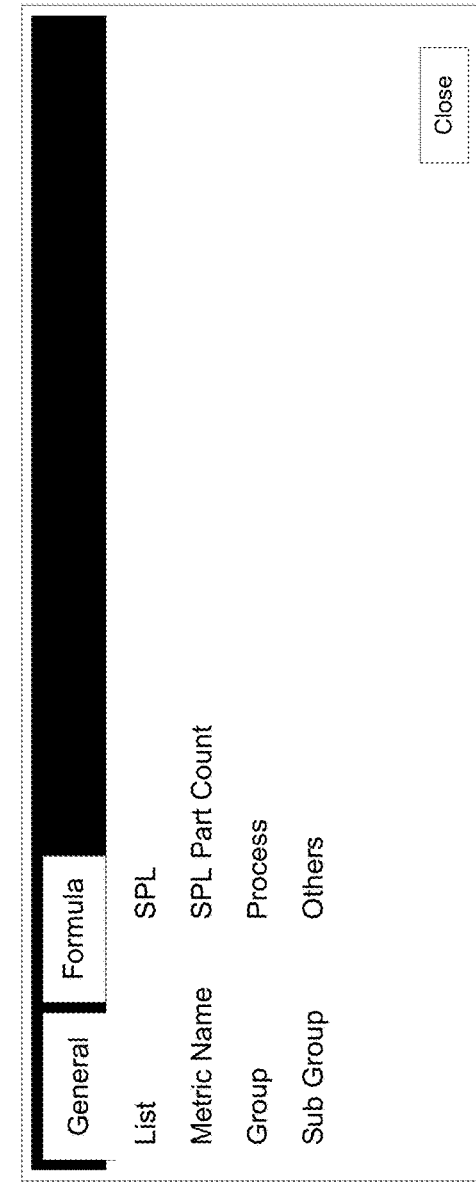
FIG. 32 is a diagram depicting aspects of the KPI process in accordance with an embodiment of the present disclosure.

Referring now to FIG. 32, an embodiment of KPI process 13 depicting an example for generating and creating custom metrics from different data sources is provided. In some embodiments, KPI process 13 may allow the user to generate custom metrics from different data sources. Some of these may include, but are not limited to, bill of material ("BOM") lists, SPL lists, lookup columns from external systems, etc. In some embodiments, the users may add the metrics to custom groups and subgroups as related to the design process. KPI process 13 may be configured to evaluate the metrics based upon the data changes in the system.

Figure 33:
FIG. 33 is a diagram depicting aspects of the KPI process in accordance with an embodiment of the present disclosure.

Referring now to FIG. 33, an embodiment of KPI process 13 depicting an example methodology for defining KPIs is provided. As shown in the Figure, the users may create KPIs in the system. In some embodiments, the KPIs may be generated based upon out of the box metrics and/or custom metrics. KPIs may be created globally and/or changed on a per project basis. For example, and as shown in FIG. 33, a KPI formula may be set by the user. In this example, the formula was set as unrouted nets/total nets >0.9. A visual indicator may also be set such as a color-coding scheme that allows a user to differentiate between the best, threshold, and worst results. After the KPI rule has been set the results may be displayed to the user as will be discussed in further detail with reference to FIG. 34.

Figure 34:
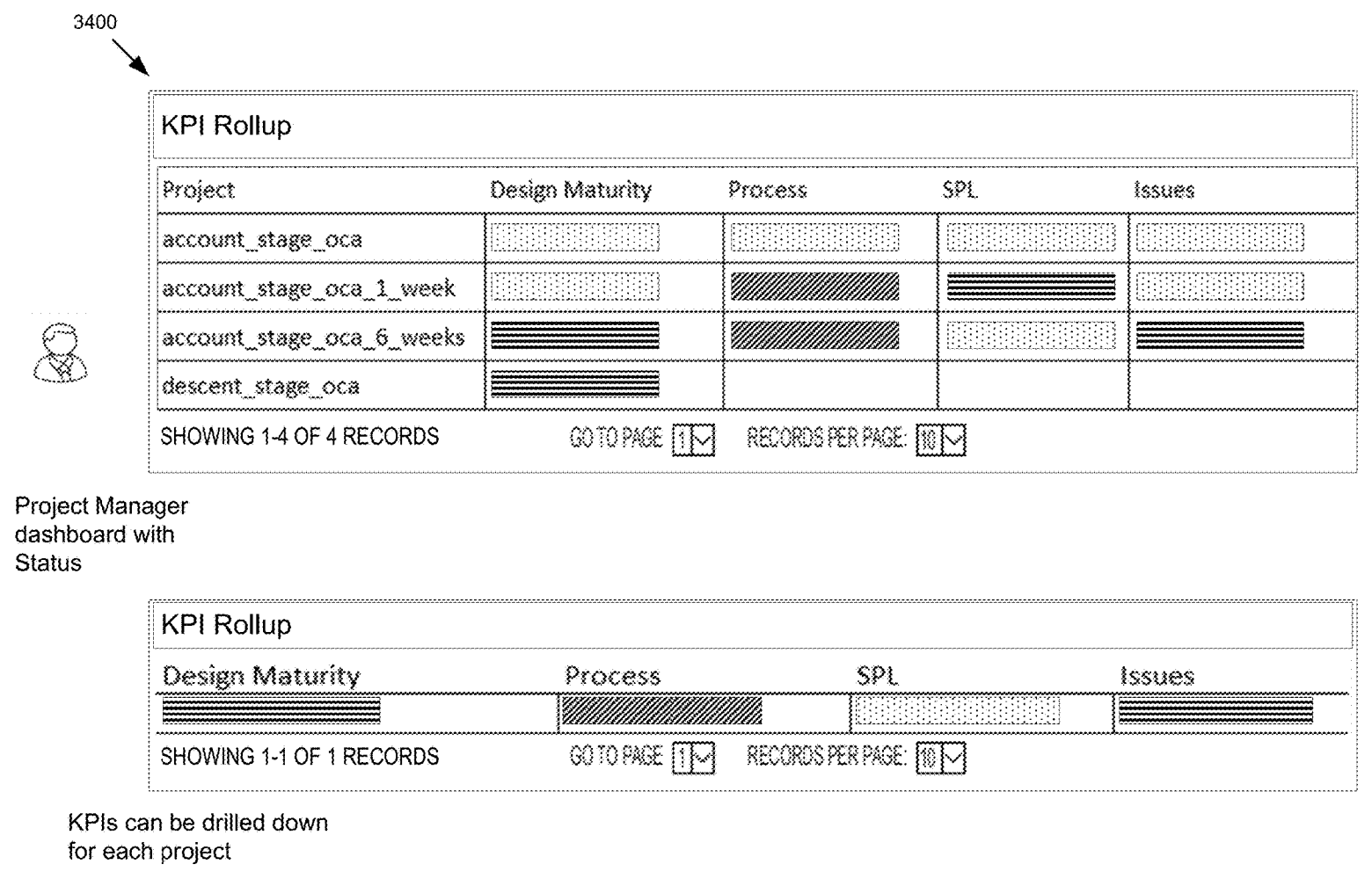

The KPIs may be displayed using any number of approaches. For example, in an aggregate view the users may create KPIs for the system. Additionally and/or alternatively, in a rollup view the KPIs may be generated upon out of the box metrics or custom metrics. Accordingly, the user may be provided with the ability to drill down from this view to see more details of the KPI. In both the cases the user can drill down to see more details on the KPI to review as is shown in the dashboard of FIG. 34.

In some embodiments, EDA application 20 and/or suggestion process 10 may support a variety of languages and/or standards. EDA application 20 may support one or more software extensions and may be used in conjunction with one or more EDA tools such as those available from the Assignee of the subject application.

As used in any embodiment described herein, the terms "circuit" and "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof. Embodiments of the present disclosure may be incorporated in whole or in part into any design tools.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A computer-implemented method for use in an electronic circuit design to be fabricated comprising:

providing, using at least one processor, an electronic circuit design;

generating a plurality of configurations, each of the plurality of configurations associated with a portion of the electronic circuit design, wherein each of the plurality of configurations corresponds to a different arrangement of design objects;

allowing a user, at a graphical user interface, to create and associate a label with each of the plurality of configurations, wherein the label identifies a phase of the electronic circuit design;

applying the configuration to at least one of a design object, a sub-design, or the electronic circuit design; and displaying, at the graphical user interface, the configuration and electronic design data associated with the configuration, wherein the graphical user interface allows the user to track one or more project schedules and to report one or more delays as the electronic circuit design progresses and allows the user to use the configuration to trigger at least one of a start date and an end date for a planned activity.

2. The computer-implemented method for use in an electronic circuit design of claim 1 further comprising:
allowing a user to lock or unlock the configuration based upon, at least in part, at least one of an assigned role or a granted permission defined for an electronic circuit design project.

3. The computer-implemented method for use in an electronic circuit design of claim 1 further comprising:
storing the configuration for use in a second electronic circuit design.

4. The computer-implemented method for use in an electronic circuit design of claim 1 further comprising:
allowing a user to remove the configuration, delete the configuration, or move the configuration to a different version of the electronic circuit design.

5. The computer-implemented method for use in an electronic circuit design of claim 1 further comprising:
determining electronic circuit design project progress based upon, at least in part, the configuration.

6. The computer-implemented method for use in an electronic circuit design of claim 1 further comprising:
identifying a project schedule associated with the electronic circuit design; and
associating one or more configuration options with a project phase change associated with an electronic circuit design project.

7. The computer-implemented method for use in an electronic circuit design of claim 1 further comprising:
linking a project milestone with implementation of the configuration.

8. The computer-implemented method for use in an electronic circuit design of claim 1 further comprising:
determining a change to the configuration; and
dynamically updating the displaying of a project schedule.

9. The computer-implemented method for use in an electronic circuit design of claim 1 further comprising:
guiding a user on applying the configuration to at least one of a design object, a sub-design, or the electronic circuit design.

10. The computer-implemented method for use in an electronic circuit design of claim 1 further comprising:
allowing a user to join a configuration for a design project, platform or a system based upon, at least in part, at least one of an assigned role or a granted permission defined for an electronic circuit design project.

11. The computer-implemented method for use in an electronic circuit design of claim 1 wherein any change in the project schedule for a project, a platform or a system based upon a configuration is displayed.

12. A non-transitory computer-readable storage medium having stored thereon instructions that when executed by a machine result in the following operations for use in an electronic circuit design:
providing, using at least one processor, an electronic circuit design to be fabricated;
generating a plurality of configurations, each of the plurality of configurations associated with a portion of the electronic circuit design, wherein each of the plurality of configurations corresponds to a different arrangement of design objects;
allowing a user, at a graphical user interface, to create and associate a label with each of the plurality of configurations, wherein the label identifies a phase of the electronic circuit design;
applying the configuration to at least one of a design object, a sub-design, or the electronic circuit design; and
displaying, at the graphical user interface, the configuration and electronic design data associated with the configuration, wherein the graphical user interface allows the user to track one or more project schedules and to report one or more delays as the electronic circuit design progresses and allows the user to use the configuration to trigger at least one of a start date and an end date for a planned activity.

13. The computer-readable storage medium of claim 12 wherein operations further comprise:
allowing a user to lock or unlock the configuration based upon, at least in part, at least one of an assigned role or a granted permission defined for an electronic circuit design project.

14. The computer-readable storage medium of claim 12 wherein operations further comprise:
storing the configuration for use in a second electronic circuit design.

15. The computer-readable storage medium of claim 12 wherein operations further comprise:
allowing a user to remove the configuration, delete the configuration, or move the configuration to a different version of the electronic circuit design.

16. The computer-readable storage medium of claim 12 wherein operations further comprise:
determining electronic circuit design project progress based upon, at least in part, the configuration.

17. The computer-readable storage medium of claim 12 wherein operations further comprise:
identifying a project schedule associated with the electronic circuit design; and
altering one or more configuration options with a project phase change associated with an electronic circuit design project.

18. A system for use in an electronic circuit design to be fabricated comprising:
a computing device having at least one processor configured to receive an electronic circuit design and to generate a plurality of configurations, each of the plurality of configurations associated with a portion of the electronic circuit design, wherein each of the plurality of configurations corresponds to a different arrangement of design objects, the at least one processor further configured to allow a user, at a graphical user interface, to create and associate a label with each of the plurality of configurations, wherein the label identifies a phase of the electronic circuit design, the at least one processor configured to apply the configuration to at least one of a design object, a sub-design, or the electronic circuit design, the at least one processor further configured to display one or more configurations and electronic design data associated with the one or more configurations wherein the graphical user interface allows the user to track one or more project schedules and to report one or more delays as the electronic circuit design progresses and allows the user to use the configuration to trigger at least one of a start date and an end date for a planned activity.

19. The system of claim 18 wherein the at least one processor is further configured to allow a user to lock or unlock the configuration based upon, at least in part, at least one of an assigned role or a granted permission defined for an electronic circuit design project.

20. The system of claim 18 wherein the at least one processor is further configured to store the configuration for use in a second electronic circuit design.

* * * * *